(12) United States Patent
Haba et al.

(10) Patent No.: US 8,513,794 B2
(45) Date of Patent: Aug. 20, 2013

(54) STACKED ASSEMBLY INCLUDING PLURALITY OF STACKED MICROELECTRONIC ELEMENTS

(75) Inventors: Belgacem Haba, Saratoga, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/274,815

(22) Filed: Oct. 17, 2011

(65) Prior Publication Data
US 2012/0032349 A1 Feb. 9, 2012

Related U.S. Application Data

(62) Division of application No. 12/221,924, filed on Aug. 7, 2008, now Pat. No. 8,043,895.

(60) Provisional application No. 60/964,069, filed on Aug. 9, 2007.

(51) Int. Cl.
*H01L 23/482* (2006.01)

(52) U.S. Cl.
USPC ........... 257/686; 257/692; 257/725; 257/777; 257/E23.07

(58) Field of Classification Search
USPC .......................................................... 438/461
See application file for complete search history.

(56) References Cited

U.S. PATENT DOCUMENTS

| | | | |
|---|---|---|---|
| 4,074,342 A | 2/1978 | Honn et al. | |
| 4,500,905 A | 2/1985 | Shibata | |
| 4,765,864 A | 8/1988 | Holland et al. | |
| 4,842,699 A | 6/1989 | Hua et al. | |
| 4,897,708 A | 1/1990 | Clements | |
| 4,954,875 A | 9/1990 | Clements | |
| 5,322,816 A | 6/1994 | Pinter | |
| 5,343,071 A | 8/1994 | Kazior et al. | |

(Continued)

FOREIGN PATENT DOCUMENTS

| | | |
|---|---|---|
| CN | 1913149 A | 2/2007 |
| DE | 19516487 C1 | 7/1996 |

(Continued)

OTHER PUBLICATIONS

Chinese Office Action for Application No. 200880109094.9 dated Jun. 30, 2011.

(Continued)

*Primary Examiner* — Stephen W Smoot
(74) *Attorney, Agent, or Firm* — Lerner, David, Littenberg, Krumholz & Mentlik, LLP

(57) ABSTRACT

A method is provided for fabricating a stacked microelectronic assembly by steps including stacking and joining first and second like microelectronic substrates, each including a plurality of like microelectronic elements attached together at dicing lanes. Each microelectronic element has boundaries defined by edges including a first edge and a second edge. The first and second microelectronic substrates can be joined in different orientations, such that first edges of microelectronic elements of the first microelectronic substrate are aligned with second edges of microelectronic elements of the second microelectronic substrate. After exposing traces at the first and second edges of the microelectronic elements of the stacked microelectronic substrates, first and second leads can be formed which are connected to the exposed traces of the first and second microelectronic substrates, respectively. The second leads can be electrically isolated from the first leads.

7 Claims, 18 Drawing Sheets

(56) References Cited

U.S. PATENT DOCUMENTS

| | | |
|---|---|---|
| 5,412,539 A | 5/1995 | Elwell et al. |
| 5,424,245 A | 6/1995 | Gurtler et al. |
| 5,426,072 A | 6/1995 | Finnila |
| 5,466,634 A | 11/1995 | Beilstein, Jr. et al. |
| 5,563,084 A | 10/1996 | Ramm et al. |
| 5,571,754 A | 11/1996 | Bertin et al. |
| 5,604,673 A | 2/1997 | Washburn et al. |
| 5,608,264 A | 3/1997 | Gaul |
| 5,614,766 A | 3/1997 | Takasu et al. |
| 5,618,752 A | 4/1997 | Gaul |
| 5,646,067 A | 7/1997 | Gaul |
| 5,656,553 A | 8/1997 | Leas et al. |
| 5,661,087 A | 8/1997 | Pedersen et al. |
| 5,682,062 A | 10/1997 | Gaul |
| 5,716,759 A | 2/1998 | Badehi |
| 5,766,984 A | 6/1998 | Ramm et al. |
| 5,767,001 A | 6/1998 | Bertagnolli et al. |
| 5,804,004 A | 9/1998 | Tuckerman et al. |
| 5,814,889 A | 9/1998 | Gaul |
| 5,817,530 A | 10/1998 | Ball |
| 5,880,010 A | 3/1999 | Davidson |
| 5,915,167 A | 6/1999 | Leedy |
| 5,946,545 A | 8/1999 | Bertin et al. |
| 5,973,386 A | 10/1999 | Horikawa |
| 6,002,167 A | 12/1999 | Hatano et al. |
| 6,022,758 A | 2/2000 | Badehi |
| 6,031,274 A | 2/2000 | Muramatsu et al. |
| 6,040,235 A | 3/2000 | Badehi |
| 6,103,552 A | 8/2000 | Lin |
| 6,130,823 A | 10/2000 | Lauder et al. |
| 6,133,640 A | 10/2000 | Leedy |
| 6,177,707 B1 | 1/2001 | Dekker et al. |
| 6,177,721 B1 | 1/2001 | Suh et al. |
| 6,188,129 B1 | 2/2001 | Paik et al. |
| 6,204,562 B1 | 3/2001 | Ho et al. |
| 6,208,545 B1 | 3/2001 | Leedy |
| 6,228,686 B1 | 5/2001 | Smith et al. |
| 6,252,305 B1 * | 6/2001 | Lin et al. .................. 257/777 |
| 6,261,865 B1 | 7/2001 | Akram |
| 6,277,669 B1 | 8/2001 | Kung et al. |
| 6,340,845 B1 | 1/2002 | Oda |
| 6,344,401 B1 | 2/2002 | Lam |
| 6,396,710 B1 | 5/2002 | Iwami et al. |
| 6,472,247 B1 | 10/2002 | Andoh et al. |
| 6,472,293 B1 | 10/2002 | Suga |
| 6,486,546 B2 * | 11/2002 | Moden et al. .................. 257/686 |
| 6,492,201 B1 | 12/2002 | Haba |
| 6,498,381 B2 | 12/2002 | Halahan et al. |
| 6,498,387 B1 | 12/2002 | Yang |
| 6,548,391 B1 | 4/2003 | Ramm et al. |
| 6,551,857 B2 | 4/2003 | Leedy |
| 6,562,653 B1 | 5/2003 | Ma et al. |
| 6,563,224 B2 | 5/2003 | Leedy |
| 6,582,991 B1 | 6/2003 | Maeda et al. |
| 6,607,938 B2 | 8/2003 | Kwon et al. |
| 6,607,941 B2 | 8/2003 | Prabhu et al. |
| 6,608,377 B2 | 8/2003 | Chang et al. |
| 6,611,052 B2 | 8/2003 | Poo et al. |
| 6,621,155 B1 | 9/2003 | Perino et al. |
| 6,624,505 B2 | 9/2003 | Badehi |
| 6,632,706 B1 | 10/2003 | Leedy |
| 6,646,289 B1 | 11/2003 | Badehi |
| 6,656,827 B1 | 12/2003 | Tsao et al. |
| 6,693,358 B2 | 2/2004 | Yamada et al. |
| 6,717,254 B2 | 4/2004 | Siniaguine |
| 6,727,576 B2 | 4/2004 | Hedler et al. |
| 6,730,997 B2 | 5/2004 | Beyne et al. |
| 6,737,300 B2 | 5/2004 | Ding et al. |
| 6,743,660 B2 | 6/2004 | Lee et al. |
| 6,753,205 B2 | 6/2004 | Halahan |
| 6,753,208 B1 | 6/2004 | MacIntyre |
| 6,777,767 B2 | 8/2004 | Badehi |
| 6,784,023 B2 | 8/2004 | Ball |
| 6,806,559 B2 | 10/2004 | Gann et al. |
| 6,828,175 B2 | 12/2004 | Wood et al. |
| 6,844,241 B2 | 1/2005 | Halahan et al. |
| 6,844,619 B2 | 1/2005 | Tago |
| 6,864,172 B2 | 3/2005 | Noma et al. |
| 6,867,123 B2 | 3/2005 | Katagiri et al. |
| 6,870,249 B2 | 3/2005 | Egawa |
| 6,878,608 B2 | 4/2005 | Brofman et al. |
| 6,897,148 B2 | 5/2005 | Halahan et al. |
| 6,958,285 B2 | 10/2005 | Siniaguine |
| 6,972,480 B2 | 12/2005 | Zilber et al. |
| 6,972,483 B1 | 12/2005 | Song |
| 6,982,475 B1 | 1/2006 | MacIntyre |
| 6,984,545 B2 | 1/2006 | Grigg et al. |
| 6,984,885 B1 | 1/2006 | Harada et al. |
| 7,001,825 B2 | 2/2006 | Halahan et al. |
| 7,005,324 B2 | 2/2006 | Imai |
| 7,034,401 B2 | 4/2006 | Savastiouk et al. |
| 7,049,170 B2 | 5/2006 | Savastiouk et al. |
| 7,060,601 B2 | 6/2006 | Savastiouk et al. |
| 7,087,459 B2 | 8/2006 | Koh |
| 7,115,986 B2 | 10/2006 | Moon et al. |
| 7,138,295 B2 | 11/2006 | Leedy |
| 7,160,753 B2 | 1/2007 | Williams, Jr. |
| 7,186,586 B2 | 3/2007 | Savastiouk et al. |
| 7,192,796 B2 | 3/2007 | Zilber et al. |
| 7,193,239 B2 | 3/2007 | Leedy |
| 7,208,343 B2 * | 4/2007 | Song et al. .................. 438/106 |
| 7,208,345 B2 | 4/2007 | Meyer et al. |
| 7,215,018 B2 | 5/2007 | Vindasius et al. |
| 7,241,641 B2 | 7/2007 | Savastiouk et al. |
| 7,241,675 B2 | 7/2007 | Savastiouk et al. |
| 7,285,865 B2 | 10/2007 | Kwon et al. |
| 7,312,521 B2 | 12/2007 | Noma et al. |
| 7,394,152 B2 | 7/2008 | Yu et al. |
| 7,408,249 B2 | 8/2008 | Badihi |
| 7,474,004 B2 | 1/2009 | Leedy |
| 7,495,316 B2 | 2/2009 | Kirby et al. |
| 7,498,661 B2 | 3/2009 | Matsuo |
| 7,504,732 B2 | 3/2009 | Leedy |
| 7,510,928 B2 | 3/2009 | Savastiouk et al. |
| 7,521,360 B2 | 4/2009 | Halahan et al. |
| 7,622,810 B2 | 11/2009 | Takao |
| 7,662,670 B2 | 2/2010 | Noma et al. |
| 7,662,710 B2 | 2/2010 | Shiv |
| 7,663,213 B2 | 2/2010 | Yu et al. |
| 7,705,466 B2 | 4/2010 | Leedy |
| 7,759,166 B2 | 7/2010 | Haba et al. |
| 7,829,438 B2 | 11/2010 | Haba et al. |
| 7,859,115 B2 | 12/2010 | Kim et al. |
| 7,884,459 B2 * | 2/2011 | Yoshida et al. .................. 257/686 |
| 7,901,989 B2 | 3/2011 | Haba et al. |
| 7,944,015 B2 | 5/2011 | Kitagawa et al. |
| 7,952,195 B2 | 5/2011 | Haba |
| 7,973,416 B2 | 7/2011 | Chauhan |
| 8,022,527 B2 | 9/2011 | Haba et al. |
| 8,043,895 B2 | 10/2011 | Haba et al. |
| 8,076,788 B2 | 12/2011 | Haba et al. |
| 8,357,999 B2 | 1/2013 | Robinson et al. |
| 2001/0024839 A1 | 9/2001 | Lin |
| 2001/0048151 A1 | 12/2001 | Chun |
| 2002/0047199 A1 | 4/2002 | Ohuchi et al. |
| 2002/0074637 A1 | 6/2002 | McFarland |
| 2002/0109236 A1 | 8/2002 | Kim et al. |
| 2002/0113303 A1 | 8/2002 | Murayama |
| 2002/0127775 A1 | 9/2002 | Haba et al. |
| 2002/0132465 A1 | 9/2002 | Leedy |
| 2002/0171145 A1 | 11/2002 | Higuchi et al. |
| 2003/0006494 A1 | 1/2003 | Lee et al. |
| 2003/0060034 A1 | 3/2003 | Beyne et al. |
| 2003/0094683 A1 | 5/2003 | Poo et al. |
| 2003/0096454 A1 | 5/2003 | Poo et al. |
| 2003/0173608 A1 | 9/2003 | Leedy |
| 2003/0209772 A1 | 11/2003 | Prabhu |
| 2003/0233704 A1 | 12/2003 | Castellote |
| 2004/0014255 A1 | 1/2004 | Grigg et al. |
| 2004/0016942 A1 | 1/2004 | Miyazawa et al. |
| 2004/0070063 A1 | 4/2004 | Leedy |
| 2004/0082114 A1 | 4/2004 | Horng |
| 2004/0104454 A1 | 6/2004 | Takaoka et al. |
| 2004/0142509 A1 | 7/2004 | Imai |

| | | |
|---|---|---|
| 2004/0155326 A1 | 8/2004 | Kanbayashi |
| 2004/0155354 A1 | 8/2004 | Hanaoka et al. |
| 2004/0169278 A1 | 9/2004 | Kinsman |
| 2004/0221451 A1 | 11/2004 | Chia et al. |
| 2004/0222508 A1 | 11/2004 | Aoyagi |
| 2004/0251525 A1 | 12/2004 | Zilber et al. |
| 2005/0003649 A1 | 1/2005 | Takao |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0067680 A1 | 3/2005 | Boon et al. |
| 2005/0073035 A1 | 4/2005 | Moxham |
| 2005/0095835 A1 | 5/2005 | Humpston et al. |
| 2005/0104179 A1 | 5/2005 | Zilber et al. |
| 2005/0156330 A1 | 7/2005 | Harris |
| 2005/0260794 A1 | 11/2005 | Lo et al. |
| 2005/0263866 A1 | 12/2005 | Wan |
| 2005/0287783 A1 | 12/2005 | Kirby et al. |
| 2006/0006488 A1 | 1/2006 | Kanbe |
| 2006/0017161 A1 | 1/2006 | Chung et al. |
| 2006/0043556 A1 | 3/2006 | Su et al. |
| 2006/0043598 A1 | 3/2006 | Kirby et al. |
| 2006/0043601 A1 | 3/2006 | Pahl |
| 2006/0046348 A1 | 3/2006 | Kang |
| 2006/0046471 A1 | 3/2006 | Kirby et al. |
| 2006/0055050 A1 | 3/2006 | Numata et al. |
| 2006/0055061 A1 | 3/2006 | Hosokawa et al. |
| 2006/0068580 A1 | 3/2006 | Dotta |
| 2006/0076670 A1 | 4/2006 | Lim et al. |
| 2006/0079019 A1 | 4/2006 | Kim |
| 2006/0094165 A1 | 5/2006 | Hedler et al. |
| 2006/0115932 A1 | 6/2006 | Farnworth et al. |
| 2006/0121645 A1 | 6/2006 | Ball |
| 2006/0138626 A1 | 6/2006 | Liew et al. |
| 2006/0175697 A1 | 8/2006 | Kurosawa et al. |
| 2006/0220234 A1 | 10/2006 | Honer et al. |
| 2006/0220262 A1 | 10/2006 | Meyer et al. |
| 2006/0249829 A1 | 11/2006 | Katagiri et al. |
| 2006/0258044 A1 | 11/2006 | Meyer et al. |
| 2006/0292866 A1 | 12/2006 | Borwick et al. |
| 2007/0007556 A1 | 1/2007 | Shibayama |
| 2007/0035001 A1 | 2/2007 | Kuhmann et al. |
| 2007/0037379 A1 | 2/2007 | Enquist et al. |
| 2007/0045803 A1 | 3/2007 | Ye et al. |
| 2007/0045862 A1 | 3/2007 | Corisis et al. |
| 2007/0052050 A1 | 3/2007 | Dierickx |
| 2007/0102802 A1 | 5/2007 | Kang et al. |
| 2007/0126085 A1 | 6/2007 | Kawano et al. |
| 2007/0132082 A1 | 6/2007 | Tang et al. |
| 2007/0148941 A1 | 6/2007 | Haba et al. |
| 2007/0158807 A1 | 7/2007 | Lu et al. |
| 2007/0181989 A1 | 8/2007 | Corisis et al. |
| 2007/0190747 A1 | 8/2007 | Humpston et al. |
| 2007/0249095 A1 | 10/2007 | Song et al. |
| 2007/0257350 A1 | 11/2007 | Lee et al. |
| 2008/0083976 A1 | 4/2008 | Haba et al. |
| 2008/0083977 A1 | 4/2008 | Haba et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 | 5/2008 | Grinman et al. |
| 2008/0116545 A1 | 5/2008 | Grinman et al. |
| 2008/0122113 A1* | 5/2008 | Corisis et al. ............. 257/777 |
| 2008/0157327 A1 | 7/2008 | Yang |
| 2008/0166836 A1 | 7/2008 | Jobetto |
| 2008/0246136 A1 | 10/2008 | Haba et al. |
| 2008/0284041 A1 | 11/2008 | Jang et al. |
| 2008/0308921 A1 | 12/2008 | Kim |
| 2008/0315407 A1 | 12/2008 | Andrews, Jr. et al. |
| 2009/0009491 A1 | 1/2009 | Grivna |
| 2009/0032966 A1 | 2/2009 | Lee et al. |
| 2009/0039528 A1 | 2/2009 | Haba et al. |
| 2009/0065907 A1 | 3/2009 | Haba et al. |
| 2009/0067135 A1 | 3/2009 | Hirai |
| 2009/0067210 A1 | 3/2009 | Leedy |
| 2009/0121323 A1 | 5/2009 | Kwon et al. |
| 2009/0160065 A1 | 6/2009 | Haba et al. |
| 2009/0166840 A1 | 7/2009 | Kang et al. |
| 2009/0166846 A1 | 7/2009 | Pratt et al. |
| 2009/0174082 A1 | 7/2009 | Leedy |
| 2009/0175104 A1 | 7/2009 | Leedy |
| 2009/0212381 A1 | 8/2009 | Crisp et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2009/0309235 A1 | 12/2009 | Suthiwongsunthorn et al. |
| 2009/0316378 A1 | 12/2009 | Haba et al. |
| 2010/0053407 A1 | 3/2010 | Crisp et al. |
| 2010/0065949 A1 | 3/2010 | Thies et al. |
| 2010/0164086 A1 | 7/2010 | Noma et al. |
| 2010/0200966 A1 | 8/2010 | Karnezos |
| 2010/0219523 A1 | 9/2010 | Chow et al. |
| 2010/0225006 A1 | 9/2010 | Haba et al. |
| 2010/0230795 A1 | 9/2010 | Kriman et al. |
| 2011/0006432 A1 | 1/2011 | Haba et al. |
| 2011/0024890 A1 | 2/2011 | Yang et al. |
| 2011/0039370 A1 | 2/2011 | Gomyo et al. |
| 2011/0198722 A1 | 8/2011 | Suh |
| 2011/0248410 A1 | 10/2011 | Avsian et al. |
| 2012/0025364 A1 | 2/2012 | Hoshino et al. |

FOREIGN PATENT DOCUMENTS

| | | |
|---|---|---|
| DE | 102004039906 A1 | 8/2005 |
| EP | 0926723 A1 | 6/1999 |
| EP | 1041624 A1 | 10/2000 |
| EP | 1482553 A2 | 12/2004 |
| EP | 1519410 A1 | 3/2005 |
| EP | 1619722 A1 | 1/2006 |
| EP | 1653510 A2 | 5/2006 |
| EP | 1686627 A1 | 8/2006 |
| EP | 1 741 668 A2 | 1/2007 |
| EP | 1801866 A2 | 6/2007 |
| FR | 2704690 A1 | 11/1994 |
| JP | 60160645 A | 8/1985 |
| JP | 07-509104 A | 10/1995 |
| JP | 08306724 A | 11/1996 |
| JP | 09045848 A | 2/1997 |
| JP | 2001015683 A | 1/2001 |
| JP | 2001035995 A | 2/2001 |
| JP | 2001-217386 A | 8/2001 |
| JP | 2001210782 A | 8/2001 |
| JP | 2002093944 A | 3/2002 |
| JP | 2003-037758 A | 2/2003 |
| JP | 2003163324 A | 6/2003 |
| JP | 2003208655 A | 7/2003 |
| JP | 2004063569 A | 2/2004 |
| JP | 2004119473 A | 4/2004 |
| JP | 2004153130 A | 5/2004 |
| JP | 2004158536 A | 6/2004 |
| JP | 2005101067 A | 4/2005 |
| JP | 2005303031 A | 10/2005 |
| KR | 2006-0020822 A | 3/2006 |
| TW | I289936 | 4/2004 |
| WO | 9425987 A1 | 11/1994 |
| WO | 9845130 A1 | 10/1998 |
| WO | 9940624 A1 | 8/1999 |
| WO | 2004/025727 A1 | 3/2004 |
| WO | 2004114397 | 12/2004 |
| WO | 2005081315 A2 | 9/2005 |
| WO | 2006027981 A1 | 3/2006 |
| WO | 2007066409 A1 | 6/2007 |
| WO | 2009017758 A2 | 2/2009 |
| WO | 2009017835 A2 | 2/2009 |
| WO | 2009023462 A1 | 2/2009 |

OTHER PUBLICATIONS

Communication from PCT/US2010/000777, dated Aug. 5, 2010.
International Search Report and Written Opinion, PCT/US08/09207, dated Jan. 16, 2009.
International Search Report and Written Opinion, PCT/US2008/09207, dated Feb. 10, 2009.
International Search Report and Written Opinion, PCT/US2008/009356, dated Feb. 19, 2009.

International Search Report and Written Opinion, PCT/US2008/010746, date May 27, 2009.
International Search Report and Written Opinion, PCT/US2007/021552 dated May 29, 2008.
International Search Report from PCT/US2010/000777, dated Nov. 19, 2010.
International Search Report, PCT/US07/26095, dated Jul. 7, 2008.
International Search Report, PCT/US2008/002659 dated Oct. 17, 2008.
International Search Report, PCT/US2009/003643, dated Aug. 28, 2009.
Japanese Office Action for JP2011-554055 dated Mar. 27, 2012.
Office Action from U.S. Appl. No. 11/704,713 mailed Apr. 10, 2012.
Office Action from U.S. Appl. No. 12/908,227 mailed Apr. 9, 2012.
Partial International Search Report, PCT/US2008/0026599.
Response to Office Action from U.S. Appl. No. 11/704,713 mailed Mar. 19, 2012.
Response to Office Action from U.S. Appl. No. 12/908,227 mailed Mar. 20, 2012.
Japanese Office Action for Application No. 2010-519235 dated Nov. 13, 2012.
Chinese Office Action and Search Report for Application 200980122523 dated Aug. 20, 2012.

* cited by examiner

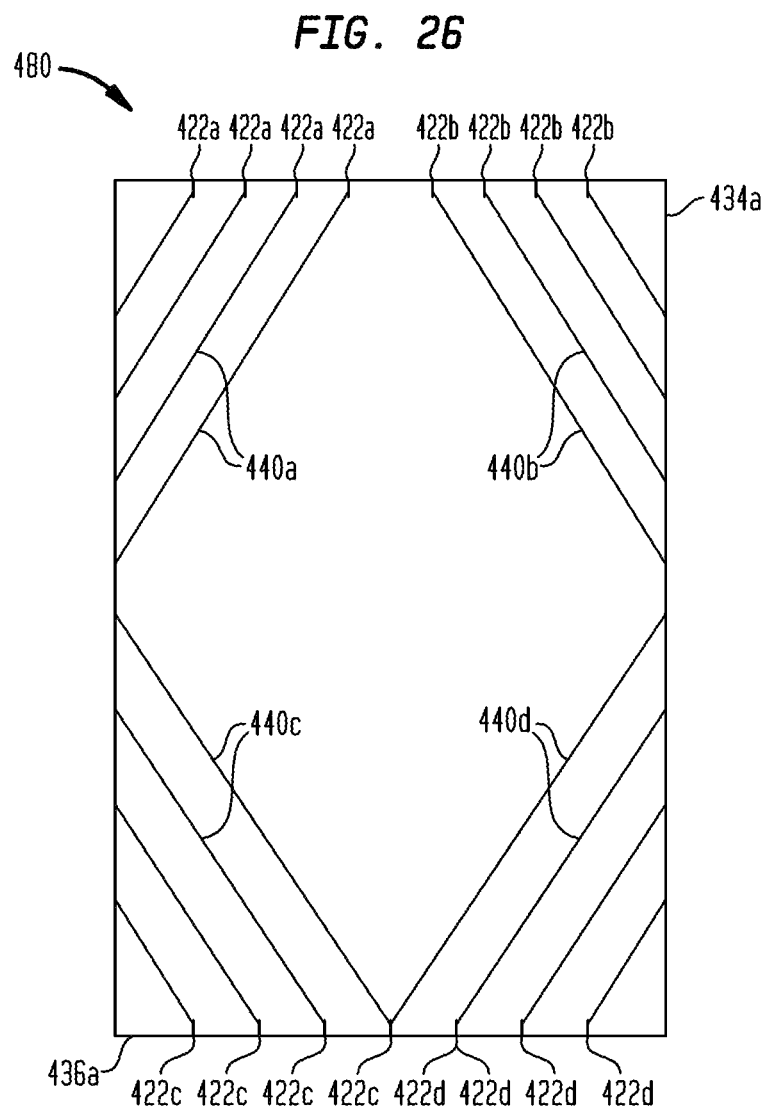

STACKED ASSEMBLY INCLUDING PLURALITY OF STACKED MICROELECTRONIC ELEMENTS

CROSS REFERENCE TO RELATED APPLICATION

The present application is a divisional of U.S. patent application Ser. No. 12/221,924 filed on Aug. 7, 2008 now U.S. Pat. No. 8,043,895, which claims the benefit of the filing date of U.S. Provisional Application No. 60/964,069 filed Aug. 9, 2007, the disclosure of which is incorporated herein by reference.

BACKGROUND OF THE INVENTION

The subject matter of the present application relates to packaged microelectronic elements and methods for packaging microelectronic elements, e.g., semiconductor elements.

Microelectronic elements, e.g., semiconductor chips are flat bodies with contacts disposed on the front surface that are connected to the internal electrical circuitry of the chip itself. Semiconductor chips are typically packaged together with other elements, e.g., chip carriers, lead frames or dielectric elements to form microelectronic packages having terminals that are electrically connected to the chip contacts. The package may then be connected to test equipment to determine whether the packaged device conforms to a desired performance standard. Once tested, the packaged chip may be connected to a larger circuit, e.g., a circuit in an electronic product such as a computer or a cell phone.

Dielectric materials used for packaging semiconductor chips are selected for their compatibility with the processes used to form the packaged chips. For example, during solder or other bonding operations, intense heat may be applied. Accordingly, metal lead frames have been used as packaging elements. Laminates have also been used to package microelectronic devices. Laminate elements may include two to four alternating layers of fiberglass and epoxy, wherein successive fiberglass layers may be laid in traversing, e.g., orthogonal, directions. Optionally, heat resistive compounds such as bismaleimide triazine (BT) may be added to such laminate elements.

Tape-like dielectric elements have also been used to form thin profile microelectronic packages. Such tapes are typically provided in the form of sheets or rolls of sheets. For example, single and double sided sheets of copper-on-polyimide are commonly used. Polyimide based films offer good thermal and chemical stability and a low dielectric constant, while copper having high tensile strength, ductility, and flexure has been advantageously used in both flexible circuit and chip scale packaging applications. However, such tapes are relatively expensive, particularly as compared to lead frames and laminate substrates.

Microelectronic packages can be formed by wafer level packaging processes where semiconductor components are packaged while the semiconductor die remain connected in a wafer form. The wafer is subjected to a number of process steps to form package structure and the wafer is diced to free the individual die. Wafer level processing may provide a cost savings advantage. Furthermore, the package footprint can be identical to the die size, resulting in very efficient utilization of area on a circuit panel, e.g., printed wiring board to which the die will eventually be attached. As a result of these features, die packaged in this manner are commonly referred to as wafer level chip scale packages (WLCSP).

In order to save space certain conventional designs have stacked multiple microelectronic chips within a package. This allows the package to occupy a surface area on a substrate that is less than the total surface area of the chips in the stack. However, conventional stacked packages can have disadvantages relating to complexity, cost, thickness and testability.

Amidst this background, there remains a need for improved wafer-scale packaging processes and especially stacked packages.

SUMMARY OF THE INVENTION

According to an embodiment of the invention, a method is provided for fabricating a stacked microelectronic assembly by steps including stacking and joining first and second like microelectronic substrates, each having a plurality of like microelectronic elements attached together at dicing lanes. Each microelectronic element has boundaries defined by edges including a first edge and a second edge. The first and second microelectronic substrates can be joined together in different orientations, such that first edges of microelectronic elements of the first microelectronic substrate are aligned with second edges of microelectronic elements of the second microelectronic substrate. After exposing traces at the first and second edges of the microelectronic elements of the stacked microelectronic substrates, first and second leads can be formed which are connected to the exposed traces of the first and second microelectronic substrates, respectively. The first and second leads can be electrically isolated from each other. The first and second leads may extend in parallel paths along the first edges of the first microelectronic elements. The first edge of each like microelectronic element can be remote from the second edge.

The method may further include severing the stacked assembly along the first and second into a plurality of unit assemblies each including at least one of the first microelectronic elements and at least one of the second microelectronic elements. Each of the like microelectronic elements has a plurality of edges. Some of the edges may be oriented transversely to other edges. For example, there may be north-south edges in the frame of reference of the substrate and east-west edges transverse to those edges. Some of the traces may extend from contacts adjacent to the north-south edges in a direction towards the east-west edges.

First and second leads may extend in parallel paths along at least some aligned edges of the plurality of edges. A particular face of the microelectronic elements, e.g., the front face, of the first and second microelectronic substrates may confront each other.

In one embodiment, a third microelectronic substrate may be aligned and joined with the first and second microelectronic substrates. The third microelectronic element may have a third orientation different from each of the first and second orientations. Third traces may extend along a first face of the third microelectronic element in interleaved paths with the second traces of the second microelectronic element. The stacked assembly may further include third leads connected to the third traces. The third leads may extend along the edges of the third microelectronic element. The third leads can be electrically isolated from the first and second leads.

A fourth microelectronic substrate may be aligned and joined with the first, second and third microelectronic substrates. The fourth microelectronic element may have a fourth orientation different from each of the first, second and third orientations. Fourth traces of the fourth microelectronic element may extend along first faces of the microelectronic elements of the fourth microelectronic substrate in interleaved paths with the first, second and third traces. The stacked assembly may further include fourth leads connected to the fourth traces. The fourth leads can extend along the edges of the fourth microelectronic element. Some or all of the fourth traces may be electrically isolated from at least some of each of the first, second and third leads.

The first faces of each of the first, second, third and fourth microelectronic elements can have the same width or length or can have the same width and length.

In accordance with an embodiment of the invention, a plurality of stacked microelectronic elements are formed. A plurality of microelectronic substrates are provided, each microelectronic substrate including a plurality of like microelectronic elements each having a face and first and second edges extending away from the face. Each of the microelectronic elements can have contacts at the face and traces extending along the face from the contacts towards the first and second edges. Traces of each microelectronic element can be spaced in a lateral direction transverse to a direction in which each trace extends. The plurality of microelectronic substrates can be stacked and joined in different orientations such that first edges of the microelectronic elements of a first one of the microelectronic substrates are aligned with corresponding second edges of the microelectronic elements of at least one second microelectronic substrate. Each of the traces of the microelectronic elements of the first microelectronic substrate at the first edges can be spaced laterally from each of the traces of the microelectronic elements of the second microelectronic substrate. The traces of microelectronic elements at first edges of the substrate can be spaced from the traces of any other of the stacked microelectronic substrates at the first edges.

Traces at the first and second edges of the microelectronic elements of the first and second microelectronic substrates can be exposed by processing, which can be performed subsequently to joining the substrates. First and second leads can be connected to the exposed traces of microelectronic elements of the first microelectronic substrate. Second leads can be connected to exposed traces of microelectronic elements of the second microelectronic substrate. The second leads can be electrically isolated from the first leads. In one embodiment, the first and second leads are formed simultaneously.

The first and second leads may extend in parallel paths along the edges of the microelectronic elements.

In one embodiment, a third microelectronic substrate including a plurality of the microelectronic elements may be joined to the stacked assembly. The third microelectronic substrate may have a third orientation which is different from orientations of each of the first and second microelectronic substrates. Edges of the microelectronic elements included in the third microelectronic substrate can be aligned with corresponding edges of the first and second microelectronic elements. Third leads connected to third traces can be formed to extend along the aligned edges of the microelectronic elements. The third leads may be interleaved with the first and second leads. Some or all of the third leads can be electrically isolated from at least some of the first and second leads.

In one embodiment, a fourth microelectronic substrate including a plurality of the microelectronic elements may be stacked and joined with the stacked assembly including the first, second and third substrates. The third microelectronic substrate may have a fourth orientation different from orientations of each of the first, second and third microelectronic substrates. Edges of the microelectronic elements included in the fourth microelectronic substrate can be aligned with corresponding edges of the first, second and third microelectronic elements. Fourth leads connected to fourth traces can be formed extend along the aligned edges of the microelectronic elements. The fourth leads may be interleaved with the leads of the first, second and third substrates. Some or all of the fourth leads can be electrically isolated from at least some of the first, second and third leads.

In one embodiment, a stacked assembly is provided which includes a plurality of stacked microelectronic elements including at least a first microelectronic element and a second microelectronic element stacked in alignment with the first microelectronic element. Each of the first and second microelectronic elements can have a first face and edges extending away from the first face. Traces can extend along the first face of each first and each second microelectronic element towards the edges. The first and second microelectronic elements can have first and second different orientations wherein first traces of the first microelectronic element extend in interleaved paths with second traces of the second microelectronic element. The stacked assembly may further include first and second leads connected to the first and second traces, respectively, and the second leads can extend along the edges and can be interleaved with the first leads. The first and second leads can extend in parallel paths along at least some aligned edges of the plurality of edges. The first and second leads may be electrically isolated from each other.

In a particular embodiment, the first faces of the first and second microelectronic elements confront each other. A third microelectronic element may be joined in alignment with the first and second microelectronic elements. The third microelectronic element may have a third orientation different from each of the first and second orientations of the first and second microelectronic elements, respectively. The third traces may extend along the first face of the third microelectronic element in interleaved paths with the first traces of the first microelectronic element and the second traces of the second microelectronic element. The stacked assembly may further include third leads connected to the third traces. The third leads can extend along the edges and may be interleaved with the first and second leads. The third leads can be electrically isolated from the first and second leads.

In a particular embodiment, a fourth microelectronic element may be joined in alignment with the first, second and third microelectronic elements. The fourth microelectronic element can have a fourth orientation different from each of the first, second and third orientations of the first, second and third microelectronic elements, respectively. The fourth traces can extend along the first face of the fourth microelectronic element in interleaved paths with the traces of the first, second and third microelectronic elements. The stacked assembly may further include fourth leads connected to the fourth traces. The fourth leads can extend along the edges and can be interleaved with the first, second and third leads. The fourth leads can be electrically isolated from the first, second and third leads. In such embodiment, the first faces of each of the first, second, third and fourth microelectronic elements can have the same width, the same length or the same width and the same length.

In a particular embodiment, each microelectronic element can have north-south edges and east-west edges. The east-west edges can include the first and second remote edges, such that the traces extend from contacts adjacent to the north-south edges in a direction towards the east-west edges.

In accordance with an embodiment of the invention, a method is provided for forming a stacked assembly having a plurality of stacked microelectronic elements. In such method, a plurality of microelectronic substrates are provided in which each microelectronic substrate can include a plurality of microelectronic elements attached together at edges defined by dicing lanes. Each of the microelectronic elements can have first and second edges and a face extending between the first and second edges. Bond pads and redistribution traces can be exposed at the face, the redistribution traces extending from the bond pads along the face towards the first and second edges. The redistribution traces of each microelectronic substrate have a pitch. In one embodiment, the pitch can be greater than a number N multiplied by a width of the redistribution traces at the first edge, N being greater than two. The redistribution traces at the first edge of a microelectronic element can be offset from the redistribution traces at the second edge in a direction of the pitch of the redistribution traces. The microelectronic substrates can be stacked with each other such that a first substrate having a first orientation is stacked with a second substrate having a second orientation. Redistribution traces at a first edge of each microelectronic element of the first microelectronic substrate can be offset from redistribution traces of each corresponding microelectronic element of the second microelectronic substrate, the corresponding microelectronic element of the second microelectronic substrate directly overlying the microelectronic element of the first microelectronic substrate.

Leads may be formed which are connected to the redistribution traces. The leads can be formed to extend about the first and second edges of the microelectronic elements of the first and second microelectronic substrates. Subsequently, the stacked first and second microelectronic substrates may be severed along the dicing lanes into individual stacked assemblies having first and second edges. In one embodiment, closest adjacent leads at the first edges of the microelectronic elements can be laterally spaced from each other.

BRIEF DESCRIPTION OF THE DRAWINGS

FIG. 26 is a partial plan view illustrating a stacked assembly in accordance with another embodiment of the invention.

DETAILED DESCRIPTION

Accordingly, embodiments of the invention herein provide ways of forming stacked assemblies containing a plurality of stacked microelectronic elements. In one embodiment, leads extend along edges of each resulting stacked assembly, where the leads from one microelectronic element extending along one edge of the assembly are laterally spaced from the leads of other microelectronic elements which extend along that edge. In this way, electrical isolation can be provided between the leads of each microelectronic element at that edge.

Figure 1:
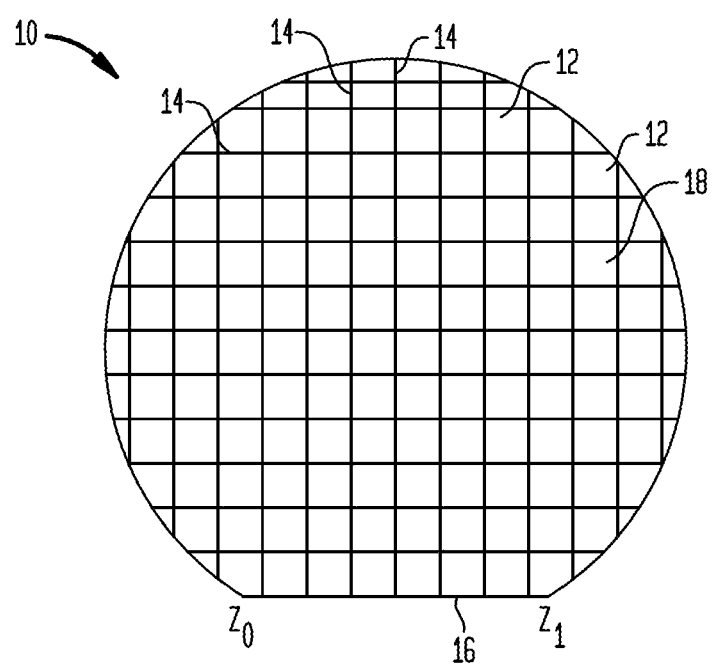
FIG. 1 is a plan view illustrating a microelectronic substrate, e.g., a wafer including a plurality of microelectronic elements in a stage of a fabrication method in accordance with an embodiment of the invention.

A wafer-level method will now be described for fabricating a plurality of stacked assemblies. FIG. 1 is a top plan view illustrating a microelectronic substrate such as a semiconductor device wafer 10. The wafer 10 includes a plurality of microelectronic elements 12, e.g., semiconductor device chips, passive device chips, or combination chips including both active and passive devices, etc., which are attached together at dicing lanes 14. The microelectronic elements 12 typically need to be packaged and severed from the wafer 10 before being used in a final product. Typically, the wafer 10 has the shape of a circular disk, except for a flat side 16. The flat side helps in aligning the wafer with equipment and packaging layers during manufacturing processes. As illustrated in FIG. 1, the flat side 16 intersects the circular perimeter of the wafer 10 at two points Z0 and Z1. The microelectronic elements of the wafer have active faces 18, also referred to as front faces, adjacent to which microelectronic devices are provided. In FIG. 1, where the active faces 18 are oriented face up (i.e., towards the viewer in the illustrated view, and the flat side 16 of the wafer lies at the bottom edge, the flat side defines a line extending in a left to right direction from Z0 to Z1.

Figure 2:
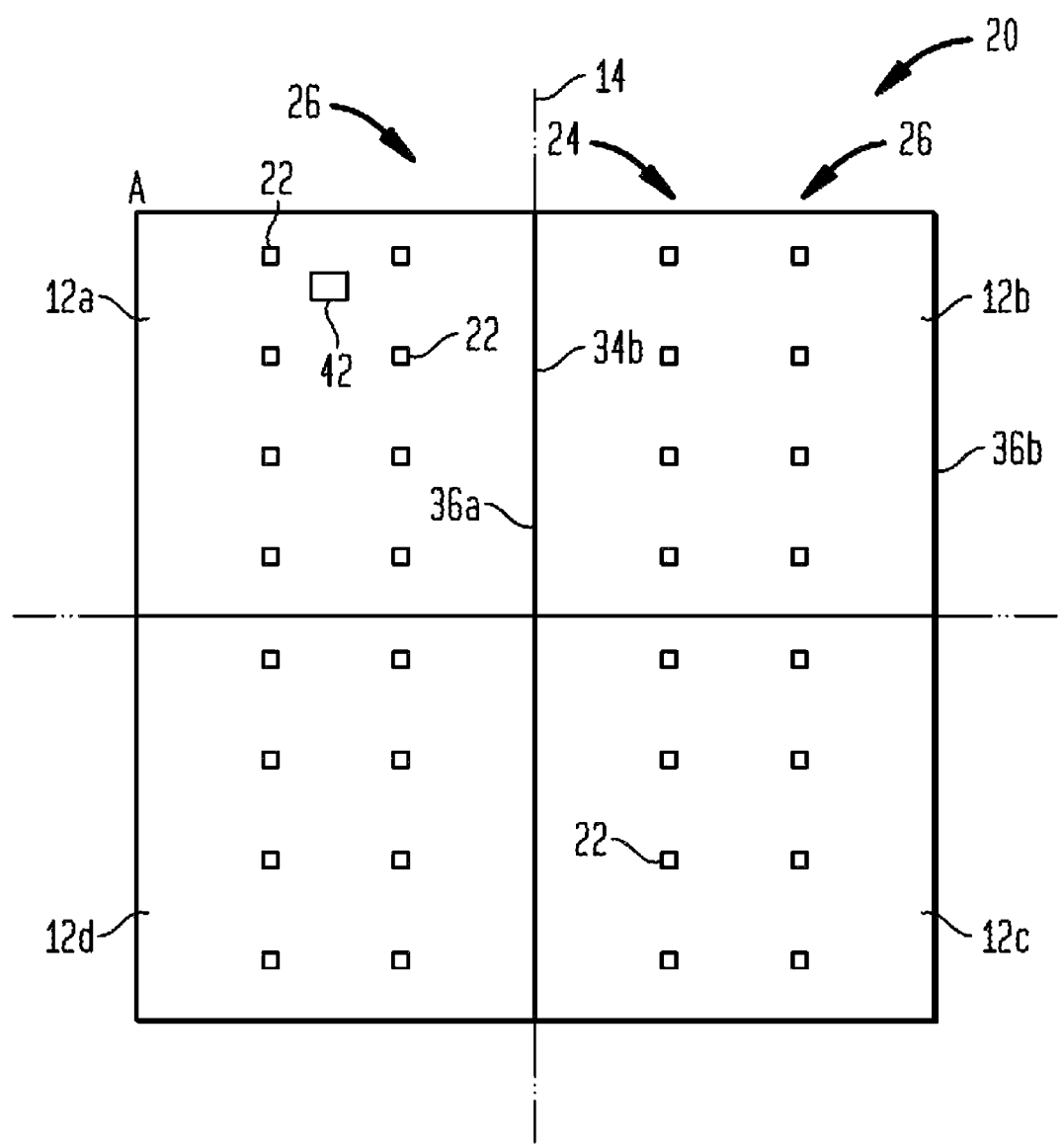
FIG. 2 is a partial plan view illustrating further detail of the microelectronic substrate depicted in FIG. 1.

For ease and clarity of illustration, FIG. 2 is a partial top plan view illustrating a microelectronic substrate 20, e.g., a portion 20 of a wafer 10, containing four microelectronic elements 12a, 12b, 12c, and 12d, e.g., semiconductor chips, each having edges defined by dicing lanes 14. In the embodiment of the invention described in the following, the wafer 10 remains intact such that the portion remains connected with the remainder of the wafer. However, the processes described in the following can be performed in relation to microelectronic substrates smaller than a complete wafer, such as a substrate which includes one microelectronic element (one chip), a few chips or many chips. Contacts, e.g., bond pads, lands, etc., of the chips 12 are shown at 22. The contacts typically are laid out in parallel rows, a first row of contacts 24 of chip 12b being adjacent to a first edge 34b and a second row 26 of contacts being adjacent to a second edge 36b of chip 12b. Similarly, a second row 26 of contacts of chip 12a is adjacent to a second edge 36a of that chip. One or more alignment markings 42 on the substrate may be used to determine and maintain the orientation of the substrate in the plane defined by the major surface of the substrate.

Figure 3:
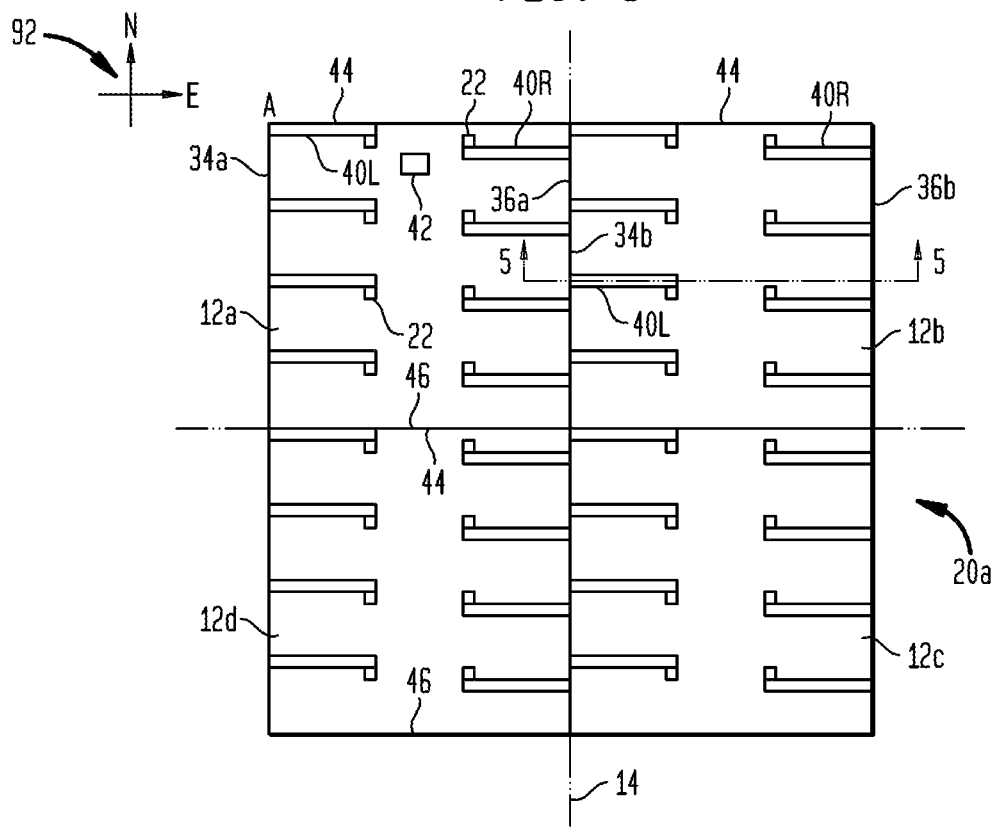
FIG. 3 is a partial plan view illustrating detail of the microelectronic substrate depicted in FIG. 1 in a stage of a fabrication method subsequent to that depicted in FIG. 2.

FIG. 3 illustrates a subsequent stage of processing in which traces 40 are fabricated on each chip of the substrate 20a. Layout directions in form of familiar compass directions are indicated by legend 92. Reference is also made herein to traditional top, bottom, left and right layout directions when describing the substrate in plan view. The reference to compass directions is for convenience in identifying relative directions between elements in the following description. The elements described in the following may or may not be aligned with the true directions of a compass. The traces are connected to and extend from the contacts 22 towards edges of each chip. The traces may extend from the contacts towards left and right edges (north-south direction) edges 34, 36 of each chip and not towards the top and bottom edges (east-west direction) edges 44, 46 of each chip. The traces can be manufactured in a semiconductor fabrication facility as conductors extending along a surface of an external passivation layer of the chip at or above the level of the contacts 22. The traces can be provided during fabrication of a "redistribution layer", which can be constructed either during fabrication in the semiconductor fabrication facility or in subsequent processes, such as those performed in a facility which packages the wafer or a portion of a wafer into packaged chips.

As illustrated in FIG. 3, traces 40L can extend in parallel paths from contacts 22 on chip 12a towards edges 34a, 36a. Traces 40R can also extend from contacts 22 on chip 12b towards edges 34b, 36b, which may be in parallel paths. The traces can extend all the way to the dicing lanes 14 along adjacent edges between chips 12a, 12b and between chips 12c and 12d. The substrate shown in FIG. 3 is oriented the same way as the substrate illustrated in FIG. 2. Specifically, a monument of the substrate, e.g., an alignment marking 42, flat side 16 (FIG. 1), etc. has the same position on the substrate shown in FIG. 3 as it does in FIG. 2. The orientation of the substrate 20a in FIG. 3 can also be identified by the location of the marker "A" at the upper left hand corner of the figure. Here, the traces 40L extend towards left edges 34 of the chips and are connected to top edges of the contacts. On the other hand, traces 40R extend towards right edges 36 of the chip and are connected to bottom edges of the contacts. In such way, the traces 40R on the right side of each chip in FIG. 3 are displaced downwardly by the same amount that the traces 40L on the left side of each chip are displaced upwardly. For ease of reference, the substrate in the orientation shown in FIG. 3 will be referred to as substrate 20a.

Figure 4:
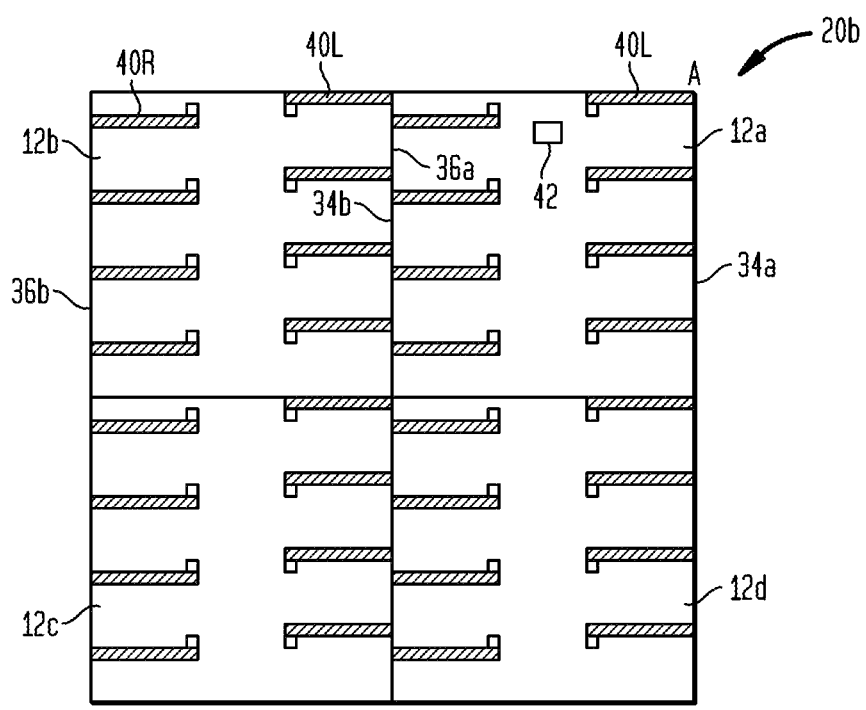
FIG. 4 is a partial plan view illustrating the microelectronic substrate in an inverted orientation with respect to that shown in FIG. 3.

FIG. 4 illustrates a substrate 20b having identical construction as illustrated in FIG. 3, but in which an orientation of the chips 12a, 12b, 12c, 12d therein is reversed in relation to that shown in FIG. 3. The reverse orientation can be understood from the location of the marker "A" in the upper right hand corner of the figure and the location of the alignment marking 42 on chip 12a. In the reverse orientation shown in FIG. 4, the edges 34a, 34b are aligned with the right hand side of each chip. Traces 40L which extend towards the right-hand edges 34a, 34b of the chips are displaced upwardly, while the traces 40R which extend towards left-hand edges 36a, 36b are displaced downwardly. Such orientation is achieved when the substrate 20a shown in FIG. 3 is flipped such that its active surface (see 50b, FIG. 6) faces down rather than up (the direction in which active surface 50a (FIG. 6) faces.

Figure 5:
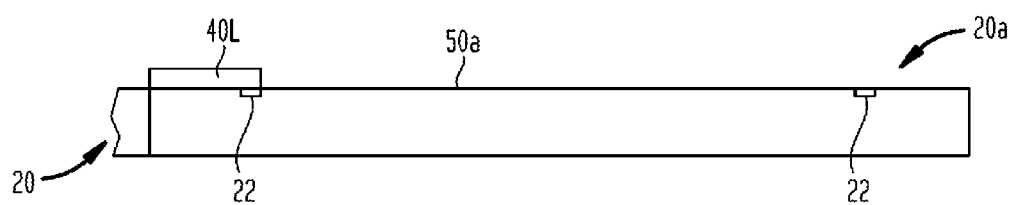
FIG. 5 is a corresponding sectional view through line 5-5 of FIG. 3.

FIG. 5 is a sectional view through line 5-5 of FIG. 3. As shown therein, substrate 20a has contacts 22 exposed at the major (active) surface 50a. As used in this disclosure, a terminal "exposed at" a surface of a dielectric element may be flush with such surface, recessed relative to such surface, or protruding from such surface, so long as the terminal is accessible for contact by a theoretical point moving towards the surface in a direction perpendicular to the surface. In the view shown in FIG. 5, only trace 40L is visible because of the relative downward or upward layout displacement of left-hand traces 40L relative to right-hand traces 40R (FIG. 3) of each chip, as discussed above. FIG. 5 represents a stage in fabrication of a stacked assembly including a plurality of chips stacked and interconnected together in one package.

Figure 6:
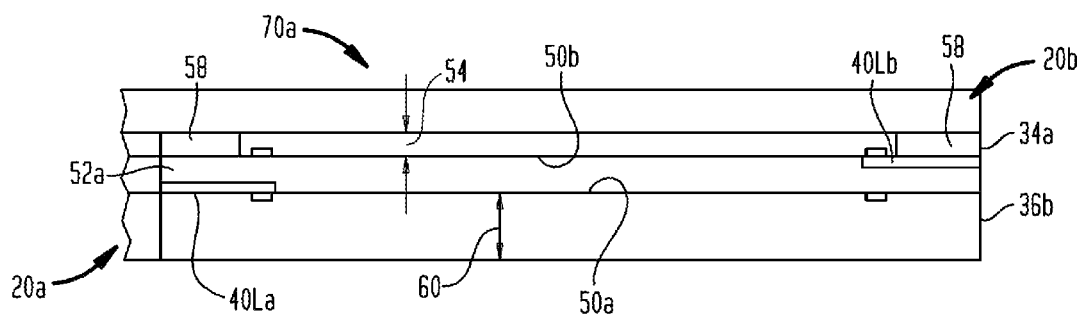
FIG. 6 is a sectional view in a stage of a fabrication method subsequent to FIG. 5.
Figure 7:
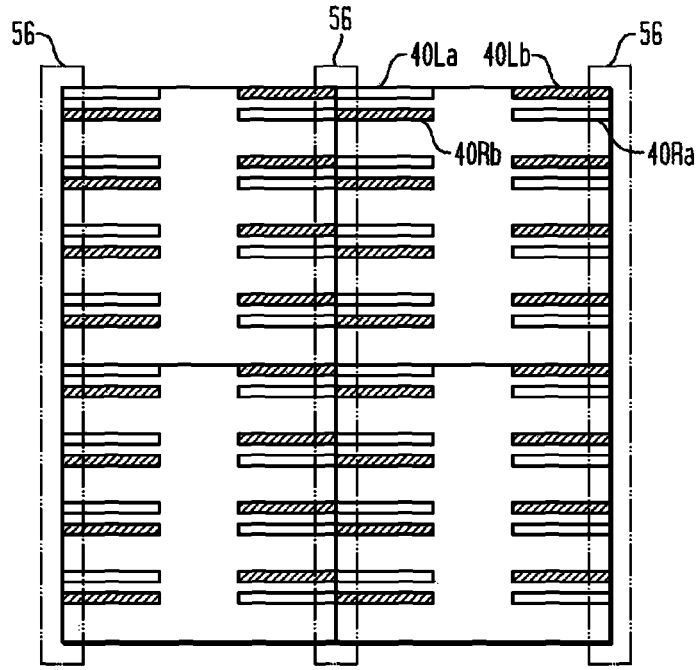
FIG. 7 is a partial plan view corresponding to the sectional view of FIG. 6.

Referring to FIG. 6, a stacked assembly 70a includes a substrate 20b mounted to substrate 20a with an adhesive layer 52a. The substrates are mounted such that active face 50b of substrate 20b confronts active face 50a of substrate 20a. The upper substrate 20b has the reverse orientation (FIG. 4) relative to the lower substrate 20a, such that edge 34a of a chip of substrate 20b is aligned with edge 36b of a chip of substrate 20a. As a result, trace 40Lb of the upper substrate 20b is not aligned with trace 40La on substrate 20a. FIG. 7 is a corresponding plan view illustrating the location of traces of both substrates after the two substrates have been joined together. Traces including trace 40La of the lower substrate are indicated by areas without hatching. The traces of the upper substrate, including trace 40Lb are shown with hatching. FIG. 7 shows the location of the traces 40La, 40Ra of the lower substrate in relation to traces 40Lb, 40Rb of the upper substrate. At edge regions 56 of the chips, none of the traces of each substrate is aligned with any other traces. As will be described in more detail below, this feature allows stacked assemblies of chips to be fabricated in which a plurality of essentially co-planar leads can be formed which connect to each chip individually. Stated another way, the non-overlapping character of the traces present at each edge of a chip permit the traces of a chip at each level in the stack to be connected to individual leads which are insulated from the leads of chips at other (higher or lower) levels in the stack. Connections to the chips in the stack need not be made only through leads which are common to a plurality of chips.

After the substrate 20b is mounted to substrate 20a, substrate 20b is thinned, e.g., by grinding and lapping, such that the resulting thickness 54 is reduced significantly in relation to the original thickness. In one example, the original thickness may be several hundred microns or more and the substrate thickness 54 after grinding may be 50 microns or less, and can be less than 15 microns. After thinning the substrate, areas 56 (FIG. 7) of the substrate at edges of each chip are etched, such that at least parts of the traces are exposed within openings resulting from the etching process. A dielectric filler such as epoxy or other polymeric material can then be deposited to cover the traces within the openings 58 to form the structure as illustrated in FIG. 6. At this stage of fabrication, a stacked assembly of substrates has been formed which includes first and second substrates in which the overall thickness of the assembly typically is not much greater than the thickness 60 of the lower substrate 20a.

Figure 8:
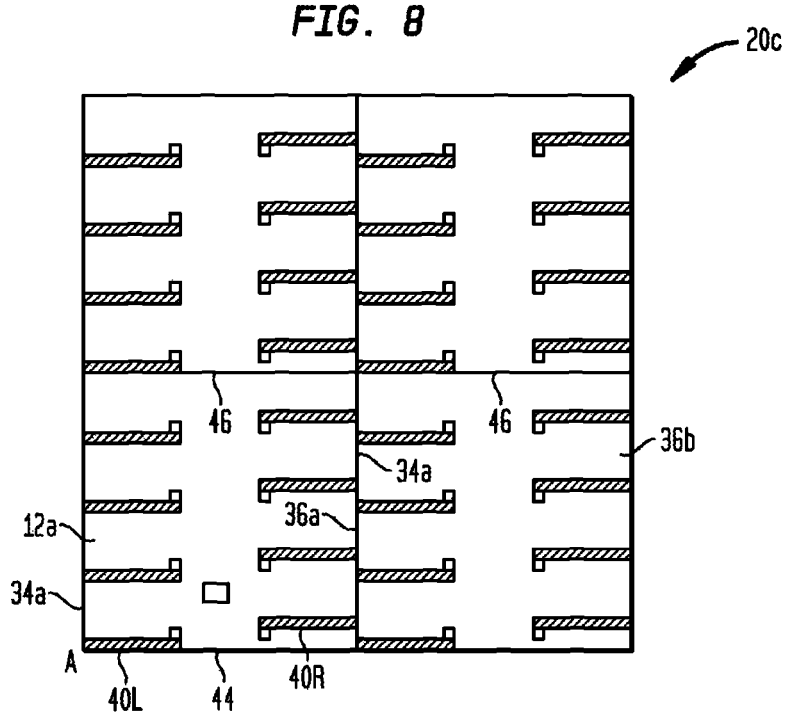
FIG. 8 is a partial plan view illustrating the microelectronic substrate with an orientation which is different with respect to that shown in FIGS. 3 and 4.

FIG. 8 illustrates a substrate 20c having identical construction as the substrate 20a illustrated in FIG. 3, but in which an orientation of the chips 12a, 12b, 12c, 12d therein is horizontally and vertically reversed in relation to that shown in FIG. 3. The orientation can be understood from the location of the marker "A" in the lower left hand corner of the figure and the location of the alignment marking 42 on chip 12a. In the orientation shown in FIG. 8, the edges 34a, 34b are disposed towards the left hand side of each chip but are now towards the lower part of the figure. Traces 40L which extend towards the left-hand edges 34a, 34b of the chips are displaced downwardly towards the edges 44 of the chips, while the traces 40R which extend towards right-hand edges 36a, 36b are displaced upwardly towards edges 46. The orientation of substrate 20c in FIG. 8 can be achieved by flipping the substrate 20a (FIG. 3) vertically and rotating it within the plane of its active surface.

Figure 9:
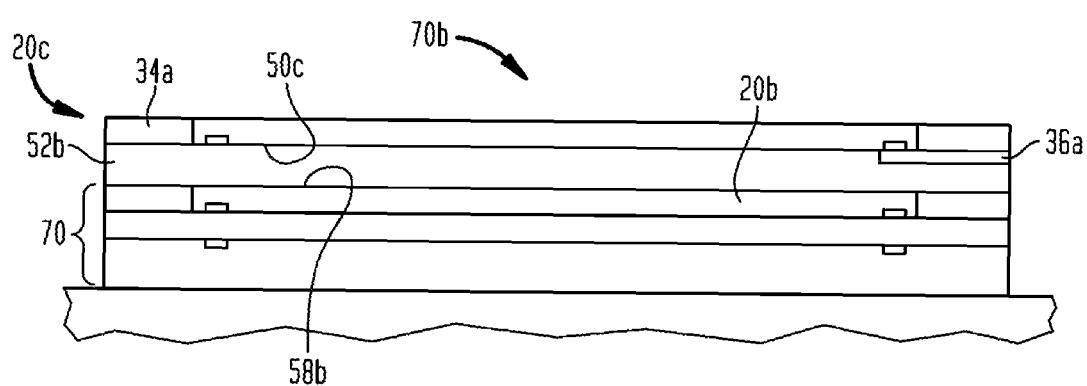
FIG. 9 is a sectional view in a stage of a fabrication method subsequent to FIG. 6.

Then, as shown in FIG. 9, a stacked assembly 70b includes a substrate 20c in the orientation shown in FIG. 8 mounted to the stacked assembly 70a (FIG. 6) with an additional adhesive layer 52b, such that active face 50c of substrate 20c faces the inactive face 58b of substrate 20b. Again, at locations defined by the edges 34a, 36a of each chip, the traces of the upper substrate 20c are not registered with any other traces of other substrates 20a, 20b at the edge locations. Stated another way, the traces of substrate 20c do not directly overlie other traces at the edges. After the substrate 20c is mounted with the stacked assembly, it is thinned and edge portions are removed and filled with a dielectric, in a manner as described above (FIG. 6).

Figure 10:
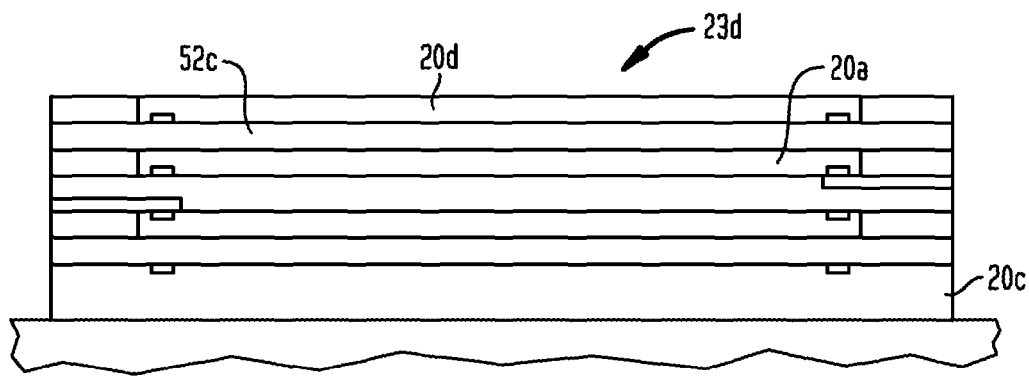
FIG. 10 is a sectional view in a stage of a fabrication method subsequent to FIG. 9.
Figure 11:
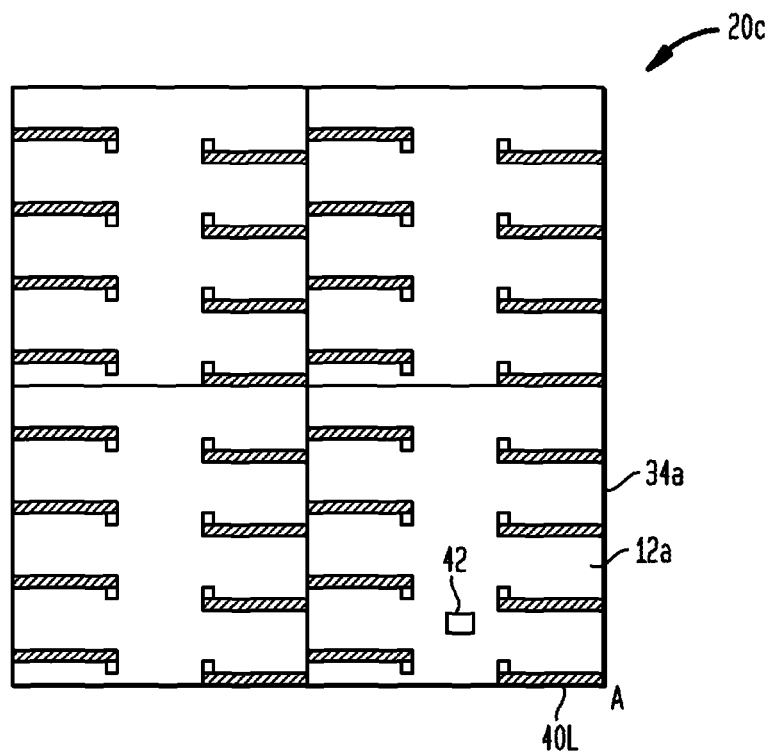
FIG. 11 is a partial plan view illustrating the microelectronic substrate with an orientation which is different with respect to that shown in FIGS. 3, 4 and 8.

Referring to FIG. 10, the stacked assembly shown in FIG. 9 is inverted such that substrate 20c lies at the bottom of the assembly, as shown. The thickness of substrate 20a then is reduced and edge regions are removed and filled with a dielectric. Thereafter, an additional substrate 20d having the orientation shown in FIG. 11 is mounted to the stacked assembly using an adhesive layer 52c (FIG. 10). Thereafter, substrate 20d also is thinned and edge portions are removed and filled with a dielectric, as described above (FIG. 6) to form a stacked assembly 230. Referring to FIG. 11, the substrate 20d is oriented in a fourth way, as indicated by marker "A" and alignment marking 42. The orientation of substrate 20d is different from each of the orientations of substrates 20a, 20b and 20c. As a result, traces 40L of substrate 20c are both displaced downwardly and towards the right-hand edges 34a of chip 12a. To obtain the orientation 20c shown in FIG. 11, the substrate 20a (FIG. 3) can be rotated in the plane of its active surface.

Figure 12:
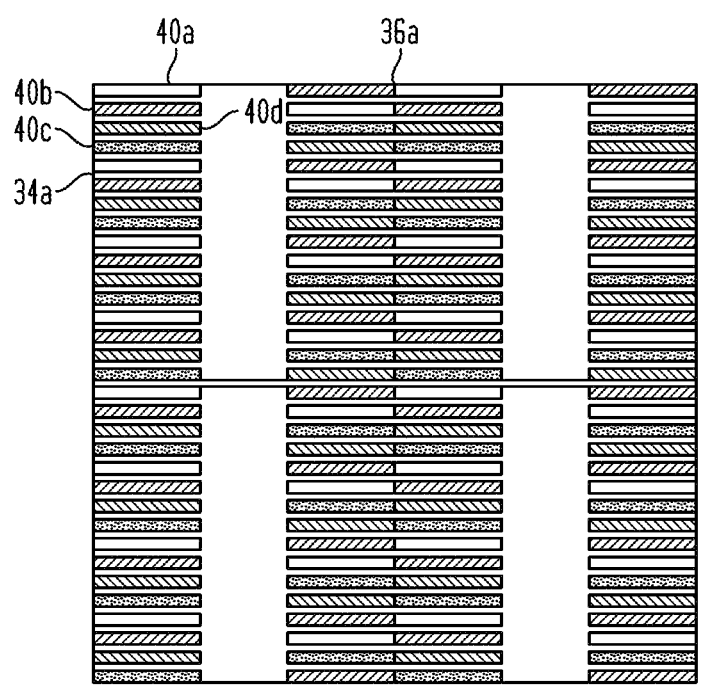
FIG. 12 is a partial plan view illustrating locations of traces within a stacked assembly in a stage of a fabrication method according to an embodiment of the invention.

FIG. 12 is a plan view illustrating the relative positions of the traces of each substrate 20a, 20b, 20c and 20d in the stacked assembly. While the traces are disposed on the substrates at different levels of the stacked assembly, the relative positions of the traces are shown in a manner as if the stacked assembly were transparent. For ease of reference, traces of substrate 20a are referenced as 40a, traces of substrate 20b referenced 40b, the traces of substrate 20c are referenced 40c and the traces of substrate 20d referenced 40d. As seen in FIG. 12, at least at first and second edges of each individual chip, e.g., edges 34a, 36a, none of the traces of the vertically stacked chips are registered with each other.

Figure 13:
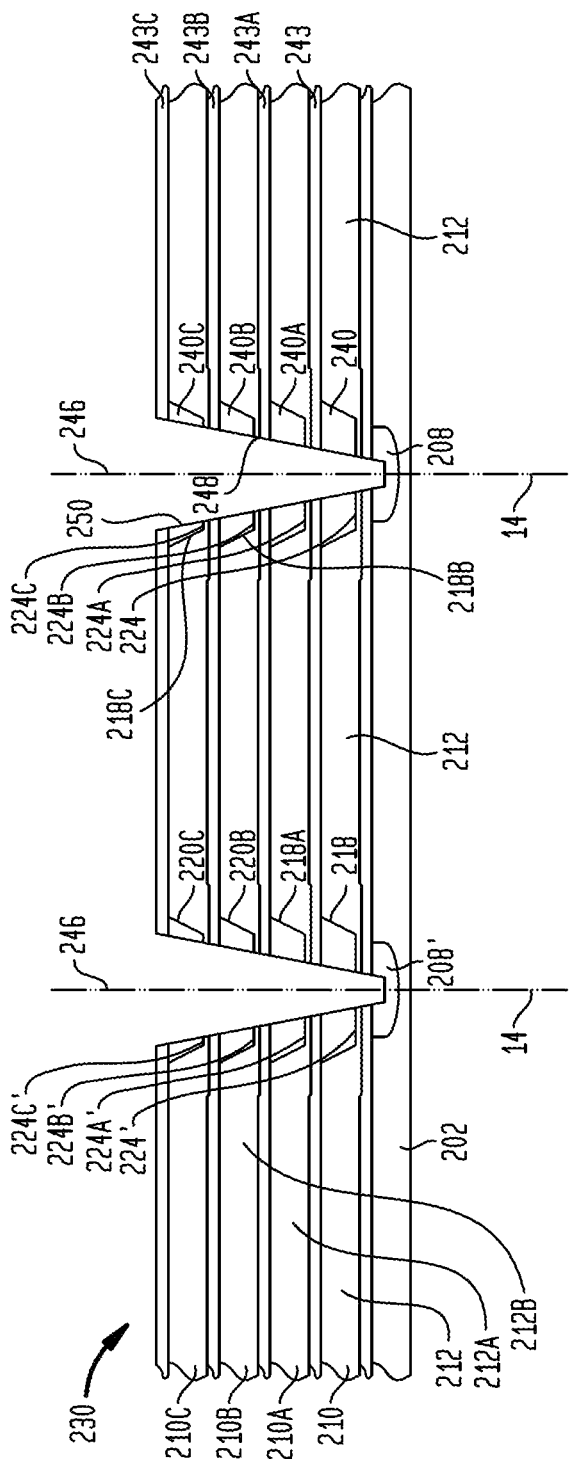
FIGS. 13-19 illustrate a series of stages in a fabrication method in accordance with an embodiment of the invention.

FIG. 13 illustrates a subsequent stage of fabrication in which a series of notches 246 are formed in the stacked assembly 230. Notches can be formed by mechanical, chemical or optical, e.g., laser ablation means, as described, for example, in commonly owned U.S. Pat. Nos. 5,455,455; 6,646,289; and 7,192,796, which are incorporated by reference herein. The notches are aligned with the dicing lanes 14 of the substrates. As seen in the sectional view provided in FIG. 13 microelectronic elements, e.g., 212 of a first substrate 210 are aligned with the microelectronic elements 212A of a second substrate 210A, the microelectronic elements 212B of the third substrate 210B, and the microelectronic elements 212C of the third substrate 210C. Notches 246 are aligned with traces 224, 224', 224A, 224A', 224B, 224B', 224C, 224C' on the microelectronic elements. In summary, the stacked assembly 230 consists of a plurality of stacked and adhered microelectronic elements 212, 212A, 212B, 212C oriented and aligned in various rows and columns.

The notches 246 are cut from the stacked assembly 230 at locations that are proximate respective first edges 218, 218A, 218B, and 218C, second edges 220, 220A, 220B and 220C of the respective microelectronic elements 212, 212A, 212B and 212C of the various substrates 210, 210A, 210B, and 210C. The notches 246 are formed at the saw lanes 14 by the methods described for the earlier embodiments. As seen in FIG. 13, the plurality of notches 246 are cut through the adhesive layers 243, 243A, 243B, 243C. Preferably, the notches 246 do not extend entirely through the stacked assembly 230 but rather extend only partially into relief cavities 208, 208' which contain dielectric material between adjacent microelectronic elements. Thus a carrier layer or additional substrate 202 remains intact to connect the stacked microelectronic elements and is protected from cracking because adhesive in the relief cavities 208, 208' rather that the substrate is cut. Although the notches 246 are illustrated having inclined side walls 248, 250, the side walls may also be straight.

The stacked assembly 230 of FIG. 13 includes four individual wafers/substrates stacked one upon another. In alternative embodiments the stacked assembly 230 may include less or more wafers/substrates positioned on top of each other. Once the various notches 246 have been created in the stacked assembly 230, leads 266 (FIG. 14) may be formed on the inclined side walls 248, 250 of notches 246. The inclined side walls 248, 250 extend through at least part of the various first, second, third and fourth substrates 210, 210A, 210B and 210C exposed at walls of the notches 246. Leads 266 may then be formed by any suitable metal deposition technique. The leads 266 may be formed by depositing a primary metal layer, e.g., by sputtering, electroless deposition, etc., along edges of the substrates 210 exposed within the notches. The primary metal layer can then be photolithographically patterned into separate leads, followed by electroplating to increase the thickness of leads and if desired, form leads having multiple different metal layers.

The leads 266 extend within the various notches 246, and establish electrical contact with the traces 224, 224A, 224B and 224C on the respective substrates 210, 210A, 210B and 210C. Preferably, the leads 266 extend along the side walls 248, 250 of notches 246 and adhere to the adhesive layer 243C on the upper surface 216C of the fourth substrate 210C. The leads 266 can include ends 275 remote from notches 246 and exposed at the surface of adhesive layer 243C. Pads or solder bumps may be provided at the ends 275 of the leads 266.

Figure 14:
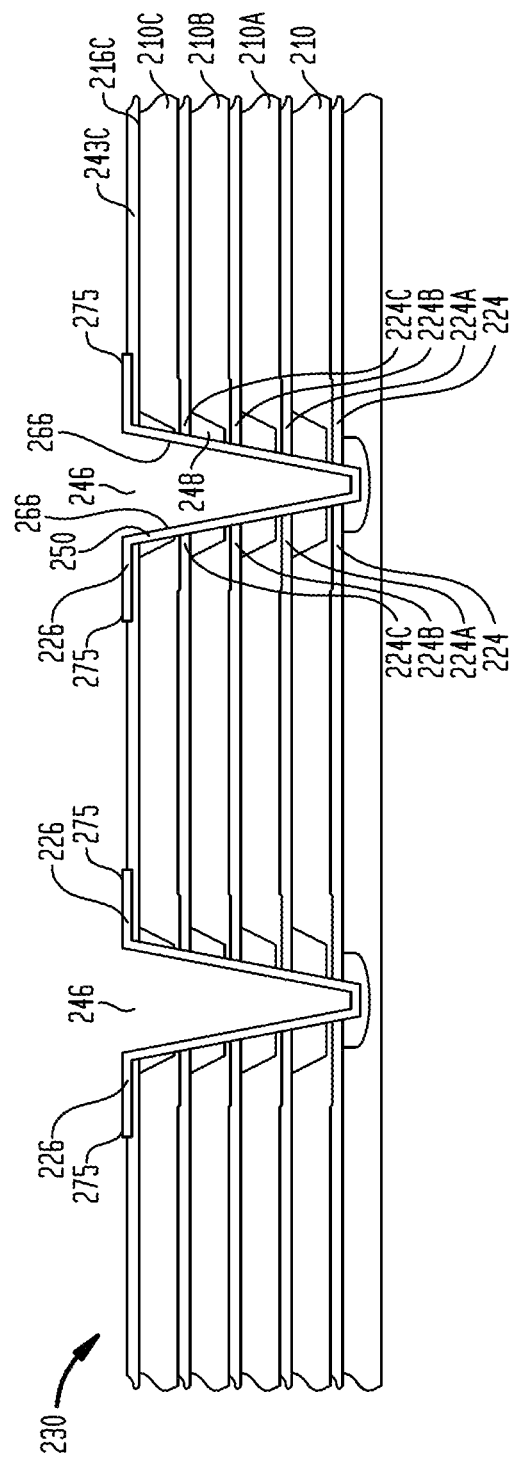
Figure 15:
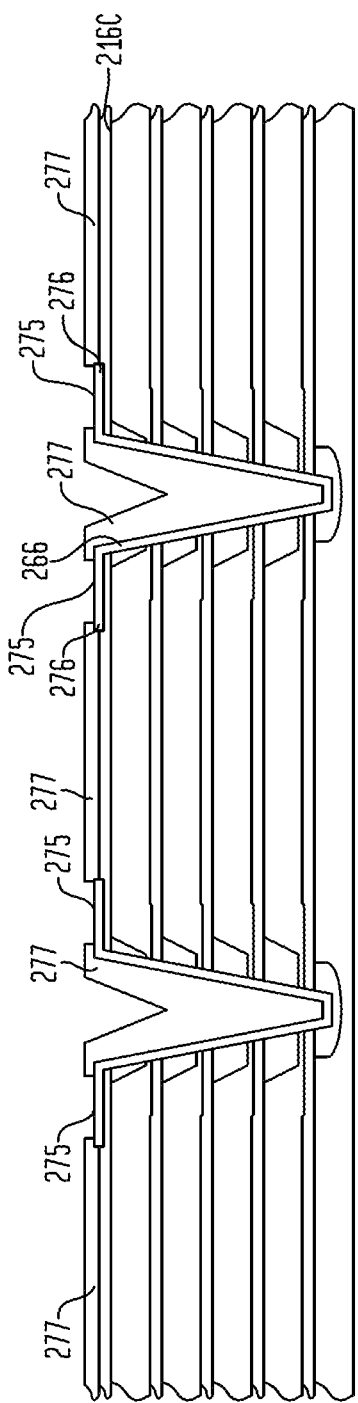

Each lead 266 preferably is in contact with only one of the four traces 224, 224A, 224B, 224C as a result of the traces being non-aligned with each other within the plane of the sectional view shown in FIG. 14, as apparent from the plan view (FIG. 12) discussed above. Typically, traces 224, 224A, 224B, 224C are positioned in different planes that reside closer or farther away from the section of the stacked assembly which is visible in FIG. 14. To that end, an insulative solder mask or other dielectric layer 277 (FIG. 15) may be patterned over the surface of adhesive layer 216C and over the leads 266, leaving pads or solder bumps at the ends 275 of the traces exposed.

In a variation of the above embodiment (FIG. 16), leads 266 may be extended to the bottom surface of the substrate 202. The leads 266 extend along the side walls 248, 250 of notches 246 and enter the adhesive layer 209 within the relief cavity 208 positioned below the first substrate 210. The bottom of leads 266 may be exposed below the lower surface of the stacked assembly 230 and the leads may be extended by the methods previously discussed to create bottom leads 286. Solder mask 227 may be patterned over the bottom surface of substrate 202 for the attachment of wires or solder bumps to allow the formation of pads or bumps at the ends 288.

A particular advantage of this arrangement (FIG. 16) is that either stacked assemblies 230 or individual packages may in turn be stacked and electrically interconnected, one upon the other by aligning and connecting the respective top ends 275 and bottom ends 288 of the leads, such as through use of solder bumps. In the example shown, the top ends 275 and bottom ends 288 can be aligned in an appropriate pattern extending in one or more directions defined by the planes of the top faces 282 and the bottom faces 284 of the stacked assembly.

Figure 16:
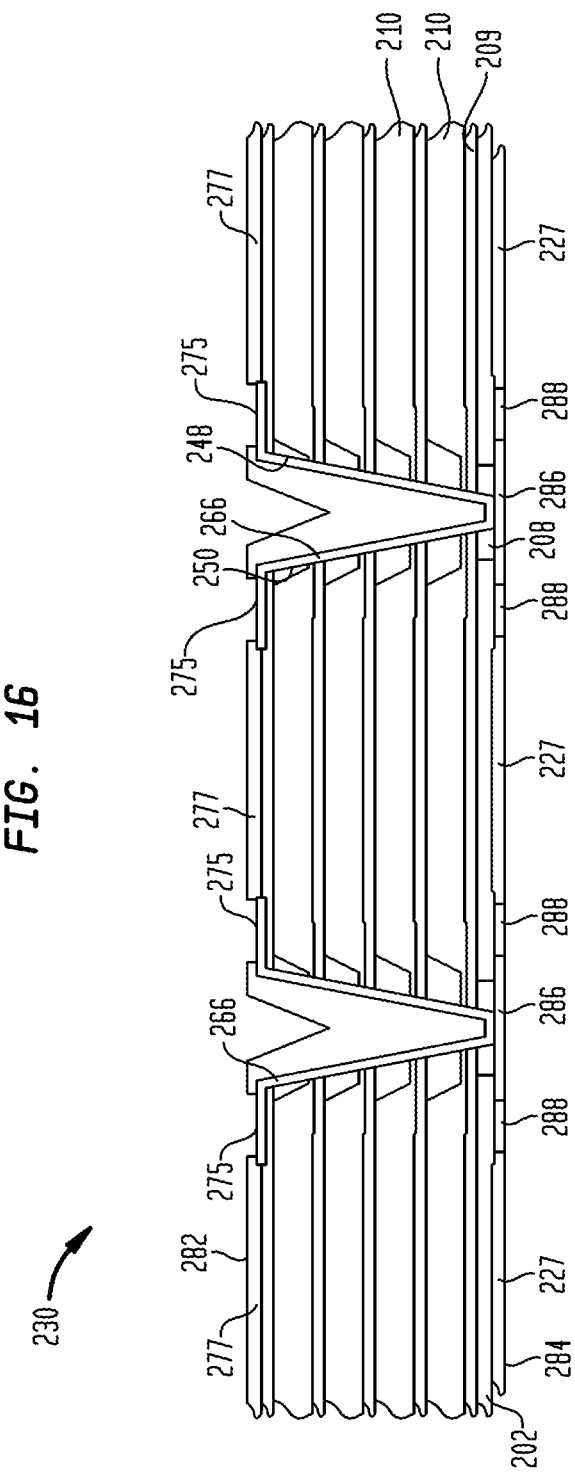

Because the leads 266 allow testing probes to access the elements, defective substrate layers may be detected and isolated to allow sorting and rework. Higher-level integration as well as wafer level rework is facilitated by the ability to stack assemblies 230. Thus, leads disposed at a bottom surface of a unit as illustrated in FIG. 16 may be connected to leads provided at a top surface of an adjacent unit through conductive masses, e.g., spheres or bumps of conductive material, e.g., solder. While having a greater overall thickness, elements from such stacked stack assemblies are functionally repaired to be equivalent to a non-defective stack assembly 230 and the value of the functioning layers 210 may be economically recovered by a wafer level rework process.

Figure 17:
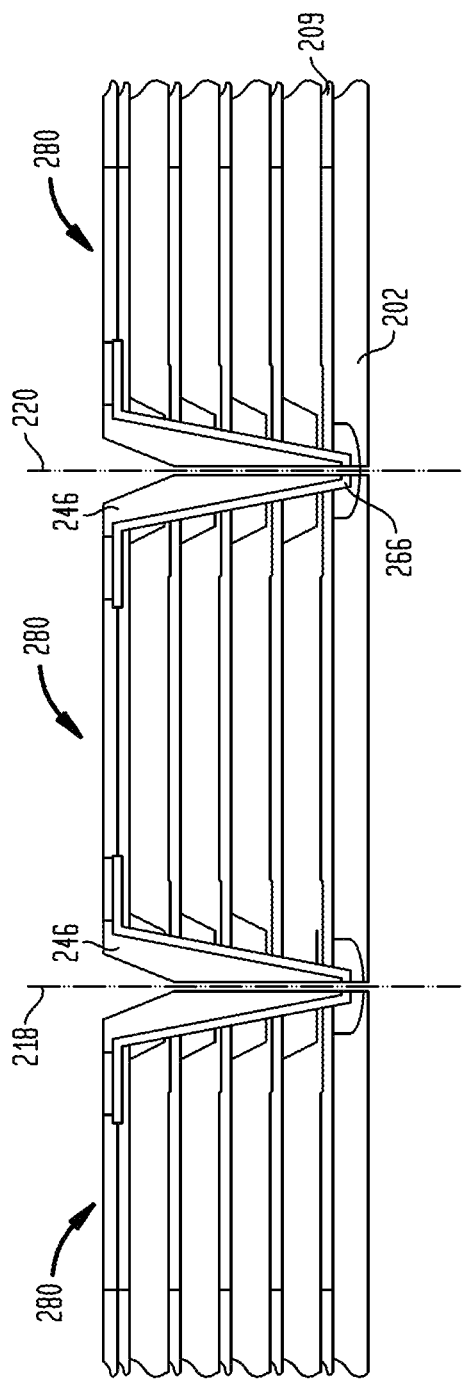

As shown in FIG. 17, after the notches 246 and various conductive elements including leads 266 are formed in the stacked assembly 230, the stacked assembly may be severed, e.g., by sawing, scribing and breaking or otherwise dicing along the dicing lanes 218, 220 into individual packaged units 280. For example, the stacked assembly may be severed into individual packages by mechanically sawing through the leads 266, the adhesive 209 and the substrate 202. The saw cuts are aligned with notches 246 such that the notches 246 are extended entirely through the thickness of the stacked assembly 230. Each of the resulting stacked packaged assemblies 280 includes a plurality of microelectronic elements, e.g., semiconductor device chips, stacked one upon another. The resulting stacked individual unit 280 shown in FIG. 18 may be externally connected to an interconnection element such as a substrate, circuit board or circuit panel via wire bonding or via pads 275 or solder bumps 274 (FIG. 19).

The above-described wafer-level processing methods result in packaged individual stacked assemblies 280 having small thickness. Where substrates of 25-30 microns each are stacked in forming the assemblies, packages incorporating four or more stacked chips, with thicknesses of approximately 155 microns or less can be achieved. In addition, with the traces on each of the microelectronic elements of each stacked assembly 280 being spaced from each other microelectronic element within the planes defined by the walls of the notches 246, each individual lead 266 of a stacked assembly can be connected to as few as one trace of just one microelectronic element. In this way, selection of individual microelectronic elements is made possible with granularity at the level of the individual microelectronic element. This can result in advantages of performance, testability and reparability, since a marginal or failing microelectronic element can be removed from an operating configuration by disconnecting leads which are connected to the failing microelectronic element. Of course, when a greater number of microelectronic elements are to be served by a single lead, one lead can be patterned to terminate in several fingers, in such way that it connects to traces of several microelectronic elements.

Figure 18:
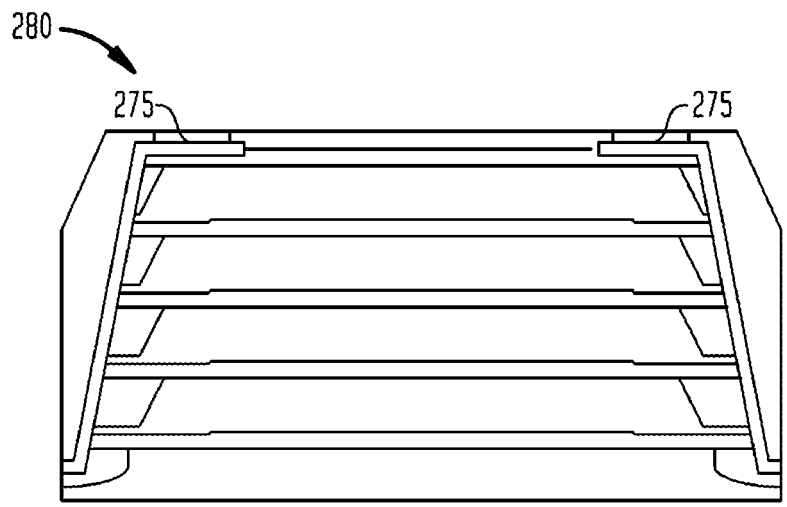
Figure 19:
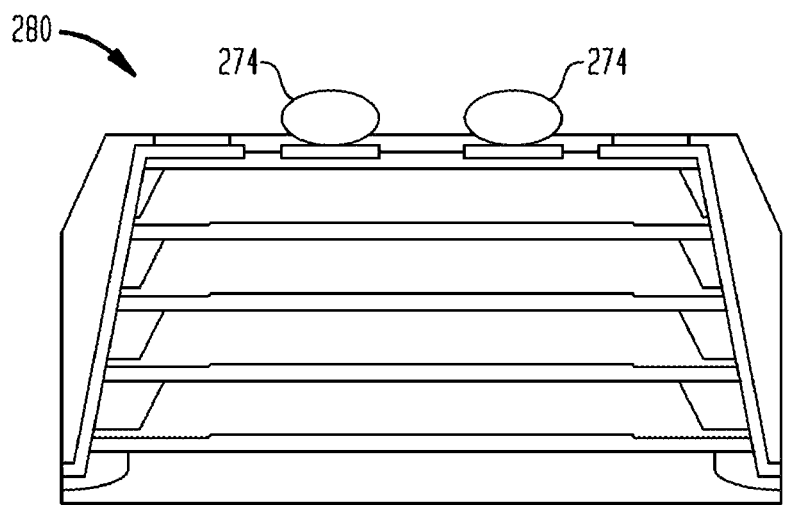
Figure 20:
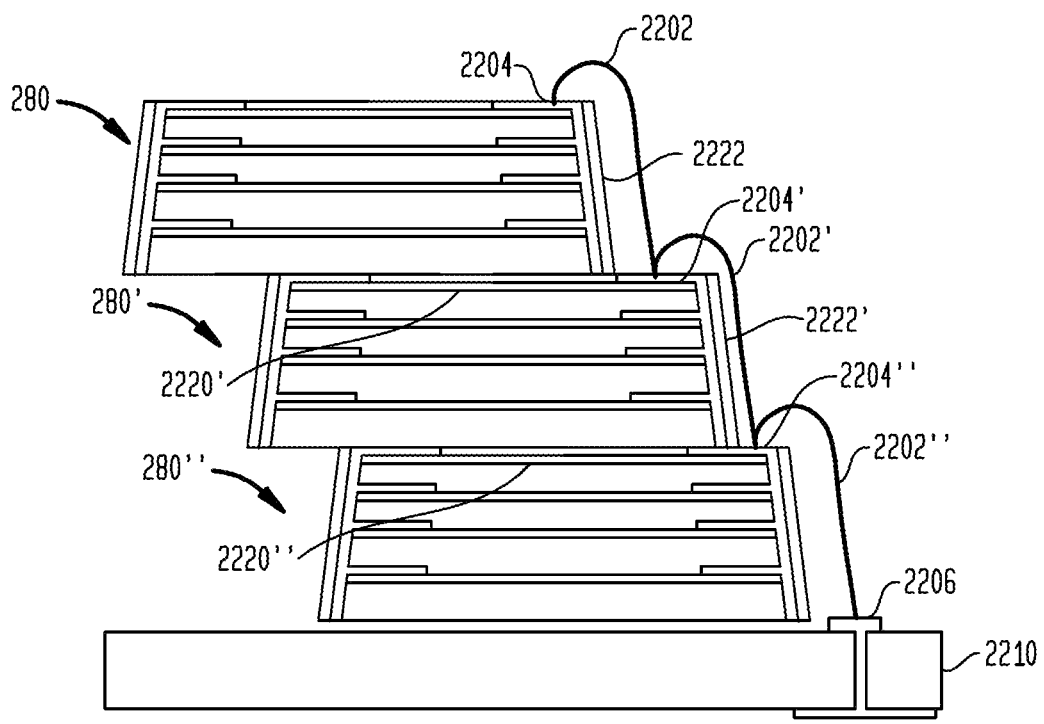
FIG. 20 is a sectional view illustrating a microelectronic unit including a plurality of stacked and conductively connected assemblies in accordance with an embodiment of the invention.

In a particular example (FIG. 20), three stacked assemblies 280 of the type shown in FIG. 18 or FIG. 19 may be stacked and interconnected. Bond wires 2202, 2202', 2202" connecting lands 2204, 2204' and 2204" of the stacked assemblies provide interconnection to terminals 2206 of a circuit panel 2210. The bond wires may be arranged to connect lands of adjacent levels as shown in FIG. 20 or each bond wire may directly connect a stacked assembly to the circuit panel. Alternatively, some of the bond wires connected to a particular stacked assembly may be connected to another stacked assembly which is not adjacent to the particular stacked assembly.

As apparent in FIG. 20, a face 2220" of a stacked assembly 280" and a land 2204" thereon extends beyond a face 2220' and an edge 2222' of stacked assembly 280' and a land 2204' thereon, thus permitting the lands 2204' and 2204" to be interconnected using bond wire 2202'. Similarly, a face 2220' of the stacked assembly 280' and the land 2204' thereon extends beyond a face 2220 and an edge 2222 of stacked assembly 230 and a land 2204 thereon, thus permitting the lands 2204' and 2204 to be interconnected using bond wire 2202.

Figure 21:
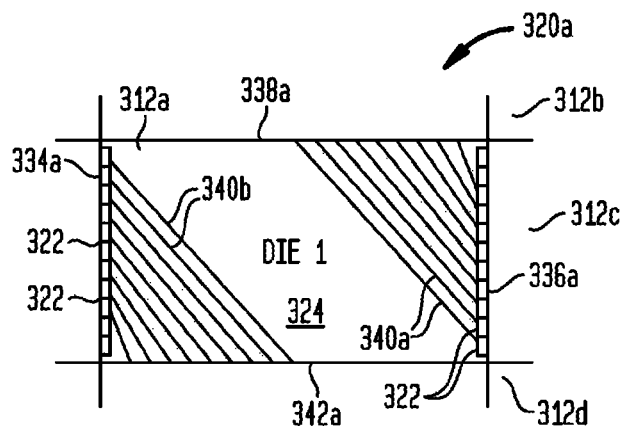
FIGS. 21-24 are partial plan views illustrating microelectronic elements in different orientations in accordance with a stage of a fabrication method in accordance with an embodiment of the invention.

Referring to FIGS. 21-25, a method is provided for fabricating stacked packaged units in accordance with a variation of the above-described embodiments. FIG. 21 is a front plan view illustrating a microelectronic substrate 320a having a plurality of microelectronic elements 312a, 312b, 312c, 312d, etc., in which contacts 322 on a front face 324 of the microelectronic element are disposed adjacent to left and right (north-south) edges 334a, 336a defined by dicing lanes 314. Traces 340A connected to contacts 322 adjacent to edge 336a extend towards a top edge 338a of the microelectronic element. On the other hand, traces 340B connected to contacts 322 extend towards a bottom edge 342a of the microelectronic element. The traces 340A and 340B may reach the top and bottom edges 338a and 342a.

Figure 22:
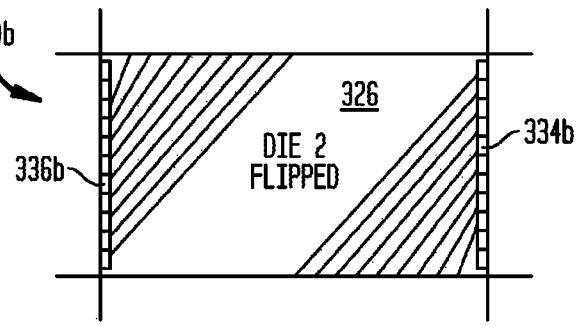

FIG. 22 is a rear plan view illustrating a microelectronic substrate 320b having the same characteristics as the substrate 320a of FIG. 21, where the substrate has been flipped over such that the view in FIG. 22 looks towards a rear face 326 of the microelectronic substrate. Because the substrate has been flipped over, the traces now appear to extend in opposite directions from those of FIG. 21.

Figure 23:
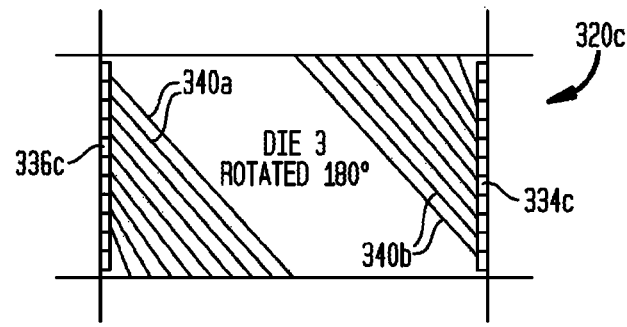

FIG. 23 illustrates still another case in which the microelectronic substrate 320c has the same characteristics as the substrate 320a (FIG. 21) but which is rotated 180 degrees from the orientation shown in FIG. 21. Here, as rotated, when the substrate 320c is stacked over substrate 320a, edge 336c of substrate 320c is aligned with edge 334a of substrate 320a. Similarly, edge 334c of substrate of substrate 320c is aligned with edge 336a of substrate 320a. In this case, as depicted in the stacked arrangement, traces 340A adjacent to edge 336c (FIG. 23) are not be in the same locations as traces 340B (FIG. 21) adjacent to edge 334a. Instead, each of traces 340A of substrate 320c adjacent to that edge are spaced from traces 340B (FIG. 21) such that each individual trace 340A, 340B is spaced apart from every other trace where it meets the top or bottom edge 338a, 342a.

Figure 24:
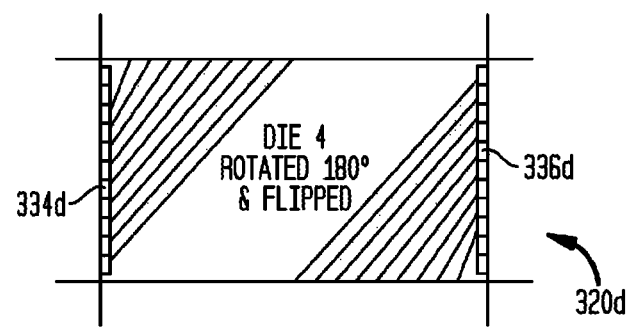

FIG. 24 illustrates still another case in which the microelectronic substrate 320d has the same characteristics as the substrate 320a (FIG. 21) but which is rotated 180 degrees and flipped over from the orientation shown in FIG. 21. When substrate 320d is stacked with substrate 320b in one stacked assembly, traces of the microelectronic substrate shown in FIG. 24 are spaced apart from traces of the microelectronic substrate 320b (FIG. 22).

Figure 25:
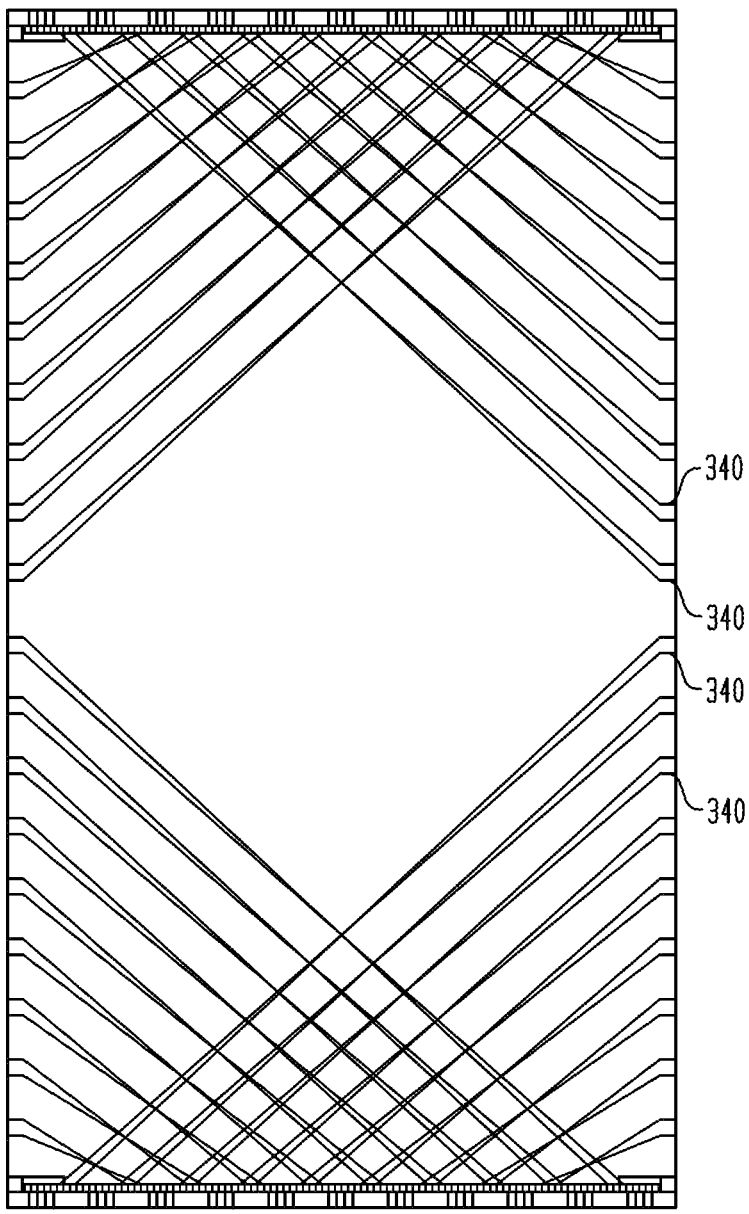
FIG. 25 is a partial plan view illustrating a stacked assembly in accordance with an embodiment of the invention.

FIG. 25 is a plan view illustrating a stacked packaged assembly 380 which includes microelectronic elements of each of the substrates 320a, 320b, 320c, and 320d (FIGS. 21-25) stacked and joined in the orientations illustrated in FIGS. 21-25. As apparent from FIG. 25, the traces 340 at edges of the packaged assembly are spaced apart such that external connection can be made to each individual trace 340 of the assembly, as described above. Steps to fabricate leads and to sever a stacked assembly into an individual stacked packaged assembly such as the one shown at 380 are similar to that described above.

FIG. 26 is a plan view illustrating a stacked packaged assembly 480 according to a variation of the above embodiment in which traces, e.g., traces 440A of each microelectronic element extend only from contacts, e.g., contacts 422a, along a limited extent of a first edge 434a. Traces 440B of a second substrate extend only from contacts 422b along another limited portion of the first edge 434a. Traces 440C of a third substrate extend only from contacts 422c along another limited portion of the first edge 436a. Traces 440D of a fourth substrate extend only from contacts 422d along another limited portion of the first edge 436a. In this way, traces at edges 438a and 442a of the stacked packaged assembly 480 are spaced apart, facilitating interconnection of leads of the stacked assembly to individual traces of individual microelectronic elements of the assembly.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A stacked assembly including first and second stacked microelectronic elements, each of said first and second microelectronic elements having a first face, edges extending away from said first face and a plurality of traces extending along said first face towards said edges, wherein said first and second microelectronic elements have first and second different orientations, wherein at least some first traces of said first microelectronic element are electrically isolated from at least some second traces of said second microelectronic element, and said stacked assembly further includes first and second leads connected to said first and second traces, respectively, said first and second leads extending along said edges.

2. A stacked assembly as claimed in claim 1, wherein said first and second leads extend in parallel paths along at least some aligned edges of said plurality of edges.

3. A stacked assembly as claimed in claim 1, wherein said first faces of said microelectronic elements confront each other.

4. A stacked assembly as claimed in claim 1, further comprising a third microelectronic element stacked in alignment with said first and second microelectronic elements, said third microelectronic element having a third orientation different from said first and second orientations, wherein at least some third traces extend along a first face of said third microelectronic element and are electrically isolated from at least some of said first and said second traces of said first and second microelectronic elements, and said stacked assembly further includes third leads connected to said third traces, said third leads extending along said edges and being electrically isolated from said first and second leads.

5. A stacked assembly as claimed in claim 4, further comprising a fourth microelectronic element stacked in alignment with said first, second and third microelectronic elements, said fourth microelectronic element having a fourth orientation different from said first, second and third orientations, wherein at least some fourth traces extend along a first face of said fourth microelectronic element and are electrically isolated from at least some of said first, second and third traces, and said stacked assembly further includes fourth leads connected to said fourth traces, said fourth leads extending along said edges and being electrically isolated from said first, second and third leads.

6. A stacked assembly as claimed in claim 5, wherein said first faces of each of said first, second, third and fourth microelectronic elements has the same width and each said face has the same length.

7. A stacked assembly as claimed in claim 1, wherein each of said first and second microelectronic elements has north-south edges and east-west edges, wherein said traces extend from contacts adjacent to said north-south edges towards said east-west edges.

* * * * *